(12) United States Patent
Kao et al.

(10) Patent No.: US 12,293,970 B2
(45) Date of Patent: May 6, 2025

(54) SEMICONDUCTOR STRUCTURE AND METHOD FOR MANUFACTURING THEREOF

(71) Applicant: TAIWAN SEMICONDUCTOR MANUFACTURING COMPANY LTD., Hsinchu (TW)

(72) Inventors: Shih-Hsiang Kao, Hsinchu (TW); Chi-Wen Chang, Changhua County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 606 days.

(21) Appl. No.: 17/461,668

(22) Filed: Aug. 30, 2021

(65) Prior Publication Data

US 2023/0065397 A1    Mar. 2, 2023

(51) Int. Cl.
| | | |
|---|---|---|
| *H01L 23/528* | (2006.01) | |
| *H01L 21/768* | (2006.01) | |
| *H01L 23/50* | (2006.01) | |
| *H01L 23/522* | (2006.01) | |

(52) U.S. Cl.
CPC .... *H01L 23/5286* (2013.01); *H01L 21/76802* (2013.01); *H01L 23/50* (2013.01); *H01L 23/5226* (2013.01)

(58) Field of Classification Search
None
See application file for complete search history.

(56) References Cited

U.S. PATENT DOCUMENTS

| | | | |
|---|---|---|---|
| 9,941,164 B1* | 4/2018 | Kim | H01L 21/76897 |
| 2016/0283631 A1* | 9/2016 | Lin | G06F 30/39 |
| 2019/0333853 A1* | 10/2019 | Kim | H01L 27/0207 |
| 2020/0104450 A1* | 4/2020 | Li | G06F 30/392 |

* cited by examiner

*Primary Examiner* — Dale E Page
*Assistant Examiner* — Derek L Nielsen
(74) *Attorney, Agent, or Firm* — WPAT LAW; Anthony King

(57) ABSTRACT

A semiconductor structure is provided. The semiconductor structure includes a substrate and a metallization layer. The metallization layer is disposed over the substrate. The metallization layer includes a first signal line, a second signal line, and a third signal line, wherein the first signal line, the second signal line, and the third signal line are arranged in a first row between a power rail and a ground rail parallel to the power rail. A first distance between the first signal line and the second signal line is different from a second distance between the second signal line and the third signal line. A method for manufacturing a semiconductor structure is also provided.

20 Claims, 26 Drawing Sheets

SEMICONDUCTOR STRUCTURE AND METHOD FOR MANUFACTURING THEREOF

BACKGROUND

With the increasing down-scaling of semiconductor devices, various processing techniques, such as, photolithography are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

One approach used to achieve the higher resolutions to manufacture, for example, 40 nm or smaller devices, is to use multiple pattern lithography. Double patterning is a technology developed for lithography to enhance the feature density. Typically, for forming features of integrated circuits on wafers, the lithography technology is used, which involves applying a photo resist, and defining features on the photo resist. The features in the patterned photo resist are first defined in a lithography mask and are implemented either by the transparent portions or by the opaque portions in the lithography mask. The features in the patterned photo resist are then transferred to the manufactured features.

With the increasing downscaling of integrated circuits, the optical proximity effect posts an increasingly greater problem. When two separate features are too close to each other, the optical proximity effect may cause the features to be shorted to each other. To solve such a problem, double patterning technology is introduced. In the double patterning technology, the closely located features are separated to two photolithography masks of a same double-patterning mask set, with both masks used to expose the same photo resist or used to pattern the same hard mask.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
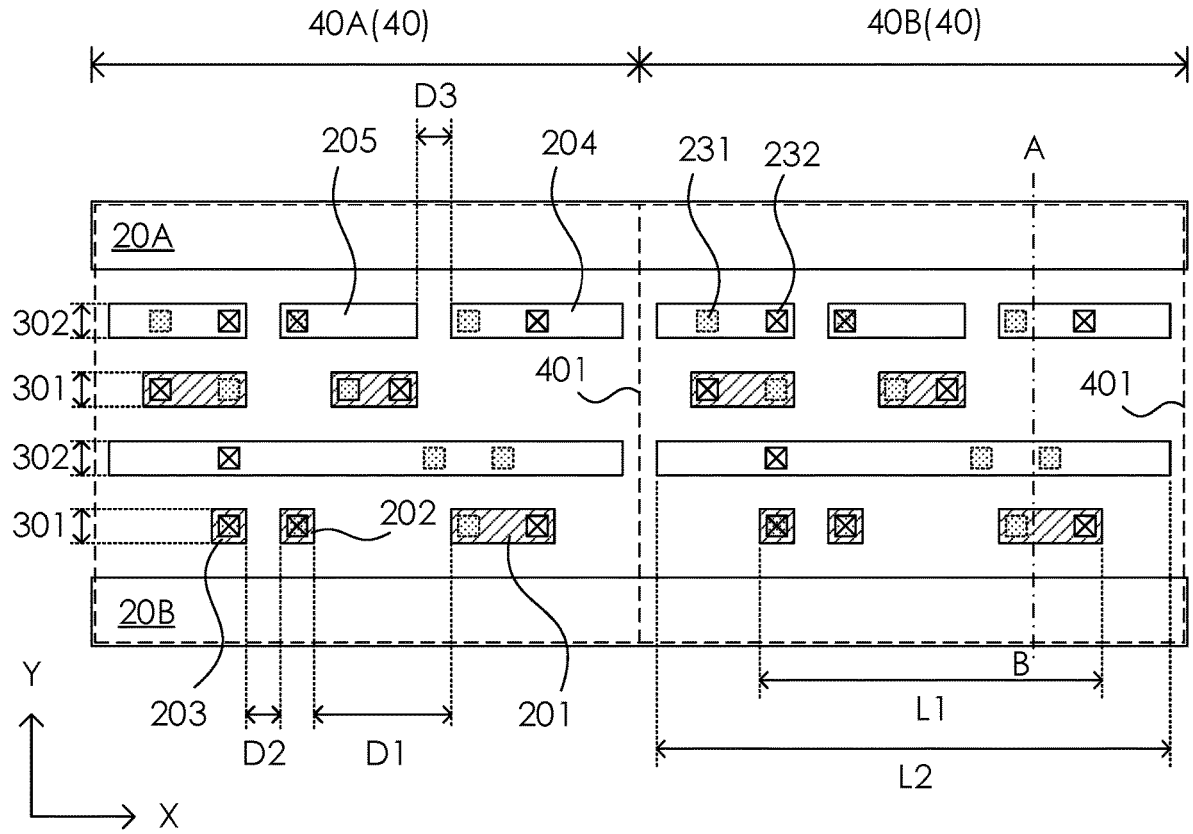
FIG. 1 illustrates a top view of a semiconductor structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

Self-aligned double patterning methods can be used in back-end-of-line (BEOL) processing and other stages of integrated circuit device manufacturing. Generally, in order to form a plurality of self-aligned conductive lines such as signal lines through the double patterning technique, a mandrel may be formed, and the shape of which is determined by a lithographic mask. The lithographic mask is used prior to the self-aligned double patterning to trim the hard mask that determines the locations of conductive lines. Some embodiments of the present disclosure provide positioning of the hard mask relative to the conductive line locations determined by self-aligned double patterning, and the shapes of the self-aligned conductive lines, or called signal lines, may be optimized to having less parasitic capacitance therebetween.

Figure 2:
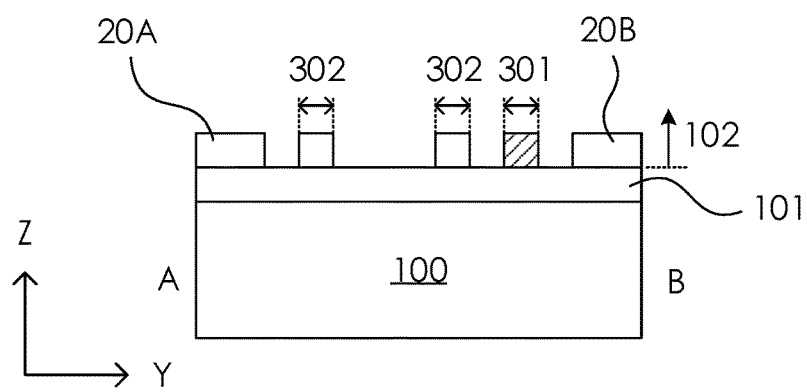
FIG. 2 illustrates a cross-sectional view of a semiconductor structure according to some embodiments of the present disclosure.

Referring to FIGS. 1 and 2, FIG. 1 illustrates a top view of a semiconductor structure which includes a plurality of signal lines within each of the cell regions, while FIG. 2 illustrates a cross-sectional view of the semiconductor structure along the line AB labeled in FIG. 1. As shown in the figures, the semiconductor structure includes a substrate 100, a mid-end-of-line (MEOL) structure 101, and a metallization layer 102. The substrate 100 may be formed of a semiconductor material such as silicon, silicon germanium, or the like. In some embodiments, the substrate 100 is a crystalline semiconductor substrate such as a crystalline silicon substrate, a crystalline silicon carbon substrate, a crystalline silicon germanium substrate, an III-V compound semiconductor substrate, or the like. Generally, a front-end-of-line (FEOL) structure (not shown in the figure) may be formed over the substrate 100 prior to forming the MEOL structure 101.

In some embodiments, active devices or device structures may be formed in or over the substrate 100. For example, the active device can be a memory device, a logical device, or a field effect transistor (FET). Device structures can include source regions, drain regions, gate electrodes, insulators, conductors, and metal interconnect layers. In some embodiments, the FEOL structure formed over the substrate 100 includes transistors therein.

In some embodiments, the metallization layer 102 formed over the MEOL structure 101 may include an etch stop layer, a dielectric layer, and a capping layer. The etch stop layer can be, for example, one or more layers of oxygen-doped, nitrogen-doped, or metal-doped silicon carbide. In some embodiments, dielectric layer is a low-k dielectric layer which has a smaller dielectric constant than $SiO_2$. Examples of low-k dielectrics that may be suitable for the dielectric layer include organosilicate glasses (OSG) such as carbon-doped silicon dioxide, fluorine-doped silicon dioxide (otherwise referred to as fluorinated silica glass (or FSG), and organic polymer low-k dielectrics. Examples of organic polymer low-k dielectrics include polyarylene ether, polyimide (PI), benzocyclbbutene, and amorphous polytetrafluoroethylene (PTFE). In some embodiments, dielectric layer is an extremely low-k dielectric layer which has a material having a dielectric constant of about 2.1 or less. An extremely low-k dielectric can be formed from a low-k dielectric material by providing the material with porosity of gaps that reduce its effective dielectric constant. The capping layer can be any suitable material. In some embodiments, the capping layer is a nitrogen-free anti-reflective layer (NFARL), for example, oxygen-doped SiC. The etch stop layer, the dielectric layer, and the capping layer layers are all optional layers.

As shown in FIGS. 1 and 2, the metallization layer 102 may include a plurality of metal lines formed by self-aligned double patterning technique. Generally, self-aligned double patterning technique may be utilized to form features having a finer pitch than would be possible by the direct application of a photolithographic process. For example, a self-aligned double patterning process may involve forming a mandrel having line-shaped features. A spacer formation process is then used to form spacers on the sides of the mandrel features. The mandrel can then be stripped leaving the spacers defining two sets of lines, wherein a set of lines corresponds to line-shaped features of the mandrel, and another set of lines corresponds to the spaces between adjacent line-shaped features of the mandrel.

As the embodiment shown in FIGS. 1 and 2, the metallization layer 102 includes a first signal line 201, a second signal line 202, and a third signal line 203 arranged in a first row 301 between a power rail 20A and a ground rail 20B parallel to the power rail 20A. The signal lines arranged in the first row 301 are the metal lines formed as the set of lines correspond to the spaces between adjacent line-shaped features of the mandrel. As shown in FIG. 1, there can be two or more first rows 301 disposed between the power rail 20A and the ground rail 20B.

In some embodiments, the metallization layer 102 further includes a fourth signal line 204 and a fifth signal line 205 having a third distance D3 therebetween and be arranged in a second row 302 between the power rail 20A and the ground rail 20B. The signal lines arranged in the second row 302 are the metal lines formed as the set of lines correspond to line-shaped features of the mandrel. Similar with the first row 301, there can be two or more second rows 302 disposed between the power rail 20A and the ground rail 20B. In some embodiments, the first rows 301 and the second rows 302 are alternately arranged between the power rail 20A and the ground rail 20B. Note the signal lines in the metallization layer 102 are laterally surrounded by dielectric materials, but it is omitted in the figures for brevity.

In order to transmit the signal to the signal lines in different sub-layers in the metallization layer 102, each of the signal lines may in contact with one or more conductive vias to electrically connect to other signal lines or active devices in other portion of the semiconductor structures. As shown in FIG. 1, in some embodiments, a first via 231 is in contact with a lower surface of the first signal line 201, while a second via 232 is in contact with an upper surface of the first signal line 201. Likewise, other signal lines also in contact with corresponding first and second vias at the lower and upper surfaces thereof, respectively. As the exemplary layout shown in the figure, the positions of the first via 231 and the second via 232 that in contact with the signal lines are not entirely arranged in line, in other words, the positions of the first via 231 and the second via 232 are corresponding to the signal or electrical requirements regarding the layout design. For example, the first via 231 in contact with the lower surface of the fourth signal line 204 in the second row 302 is in proximity to a left side of the fourth signal line 204, while the second via 232 in contact with the upper surface of the fourth signal line 204 is in proximity to a center thereof. Because the current is substantially passing within the fourth signal line 204 between the positions that the first via 231 and the second via 232 in contact with, the right portion of the fourth signal line 204, for example, may seem like a redundant or dummy portion since it is free from current passing.

In contrast, referring to the first signal line 201, there is also a first via 231 and a second via 232 in contact with the lower and upper surfaces of the first signal line 201, respectively, while the first via 231 is in proximity to an end of the first signal line 201 and the second via 232 is in proximity to another end of the first signal line 201. In other words, in such embodiments, there is few redundant/dummy portions belong to the first signal line 201. Furthermore, in the circumstances that the first via 231 and the second via 232 are vertically aligned, such as the second signal line 202 and the third signal line 203 shown in FIG. 1, the dimensions of these signal lines may be reduced to as small as possible. Note the numbering of the signal lines in FIG. 1 is not a limitation of the present embodiments, it is only utilized to identify different signal lines for describing the exemplary dimensions thereof and the distance therebetween.

The present disclosure may provide a semiconductor structure that at least one set of rows of the signal lines formed through the self-aligned double patterning technique may have fewer redundant/dummy portions, and therefore the parasitic capacitance issues induced by the signal lines may be alleviated. On the other hand, the present disclosure may be implemented based on the current self-aligned double patterning technique and an additional mask is added to expand the metal-cut for signal breaking. Accordingly, some rows of the signal lines may be shortened or entirely removed by the arrangement of the metal-cuts since at least a portion thereof is redundant.

In some embodiments, the first rows of the signal lines are further modified through such additional lithography mask, and the metal cuts utilized to break the signal lines are enlarged, and therefore the distances between the signal lines are varied. For example, as shown in FIG. 1, the distances between the signal lines (e.g., the first, the second, and the third signal lines 201, 202, 203) in the first row 301 are different. For instance, the first distance D1 between the first signal line 201 and the second signal line 202 is different from a second distance D2 between the second signal line 202 and the third signal line 203. The specific distances between the signal lines are depending on the positions of the vias in contact with, hence, in other words, the distances between the signal lines are substantially similar to the horizontal distances between the vias that belong to different signal routes. For example, the first distance D1 between the first signal line 201 and the second signal line 202 is substantially similar with the horizontal distance. Or, be similar with the distance from a top view perspective, which between the first via 231 that in contact with the lower surface of the first signal line 201 and the first/second via 231/232 that in contact with the second signal line 202. If the first and the second vias 231, 232 that in contact with the second signal line 202 are not vertically aligned, the first distance D1 is thus substantially similar with the horizontal distance between the first via 231 that in contact with the lower surface of the first signal line 201 and one of the vias that in contact with the second signal line 202 and closer to the first signal line 201.

For another thing, as shown in FIG. 1, in the circumstances that only the signal lines within the first rows 301 are modified or shortened, a first length L1 of the first row 301 and a second length L2 of the second row 302 in the cell region 40 can be different. As the example shown in FIG. 1, the semiconductor structure includes two cell regions 40A and 40B, wherein the patterns of the metallization layer 102 within each of the cell regions 40 can be the same. As the dotted lines shown in FIG. 1, the cell regions 40 can be divided into different regions 40A, 40B with such virtual cell boundaries 401. In some embodiments, the cell boundary 401 of the cell region 40 is more in proximity to an end of the second row 302 than an end of the first row 301 within the cell region 40.

Generally, the power rail 20A and the ground rail 20B are in proximity to two sides of each cell region 40. As previously mentioned, the first rows 301 and the second rows 302 are arranged therebetween. In some embodiments, because the signal lines near the ends of the first rows are shortened due to few redundant/dummy portions, the length of the first row 301 is thus shorter than the second row 302, that is, the first length L1 is shorter than the second length L2.

Note the metal-cuts employed to modify the length of the signal lines do not affect the width thereof. Because the first row 301 and the second row 302 of the signal lines are formed from the line-shaped features of the mandrels and the spaces between adjacent line-shaped features of the mandrels, the width of the signal lines within the first rows 301 and the second rows 302 are generally the same. In some embodiments, the width of the power rail 20A and the ground rail 20B are different from the signal lines within the first rows 301 and the second rows 302. In some embodiments, the width of the power rail 20A is identical to that of the ground rail 20B. In some embodiments, the width between the first row 301 and the second row 302 is identical to the width of the first row 302. In some embodiments, the width of the power rail 20A or the ground rail 20B is greater than the width of each of the signal lines. In some embodiments, a ratio between the width of the power rail 20A and the width of the first signal line 201 is greater than 2. The width of the power rail 20A and the ground rail 20B may be altered for a different supply voltage of the semiconductor structure.

Figure 3A:
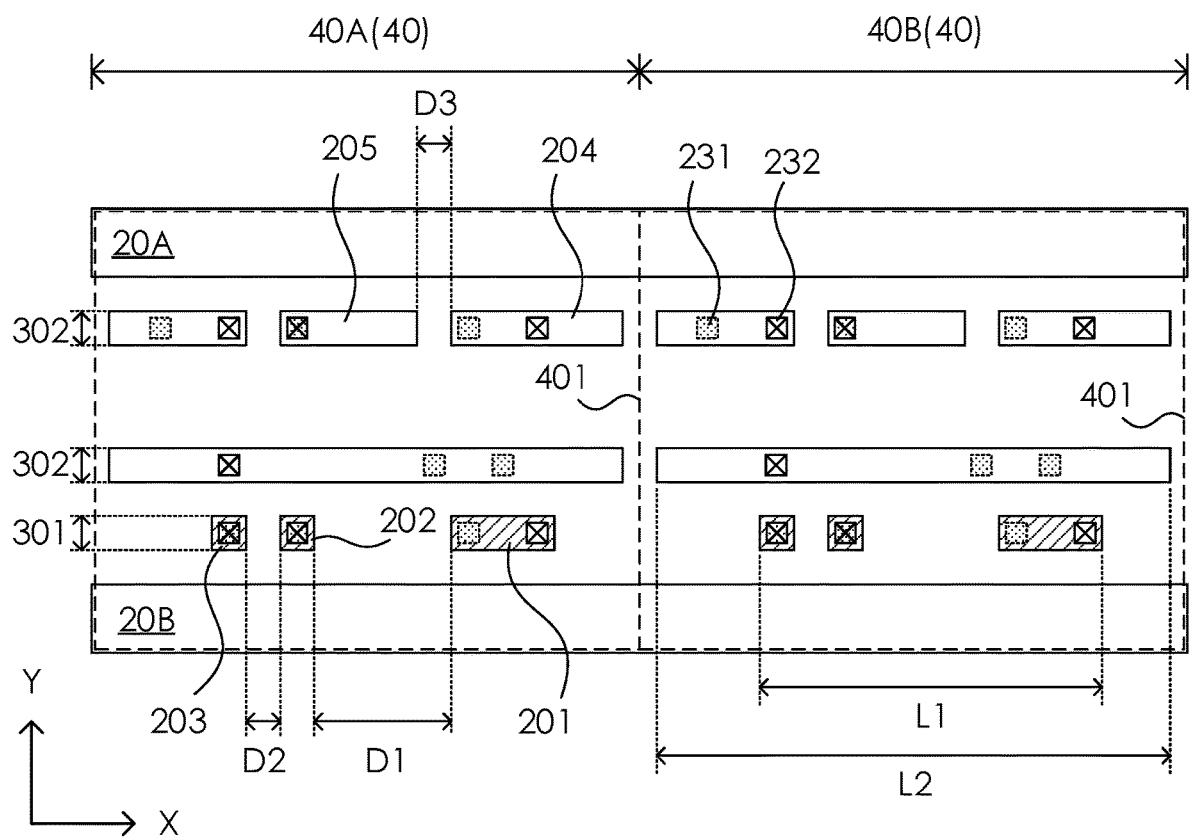
FIG. 3A illustrates a top view of a semiconductor structure according to some embodiments of the present disclosure.

In an alternative situation, some of the signal lines in the first row 301 are entirely free from in contact with the vias. That is, at least one redundant/dummy signal line and/or at least one redundant/dummy row that conventionally be formed under the process requirement of self-aligned double patterning technique, but they may be waived from forming based on the present disclosure. Or to be more precise, the redundant/dummy rows may prevent forming by utilizing the metal cuts as a mask. In the circumstances that at least one first row 301 is not formed, as shown in FIG. 3A, at least two second rows 302 are thus free from having the first row 301 therebetween. In such embodiments, the distance between the adjacent second rows 302 may three times as much as the distance between the first row 301 and the second row 302.

Figure 3B:
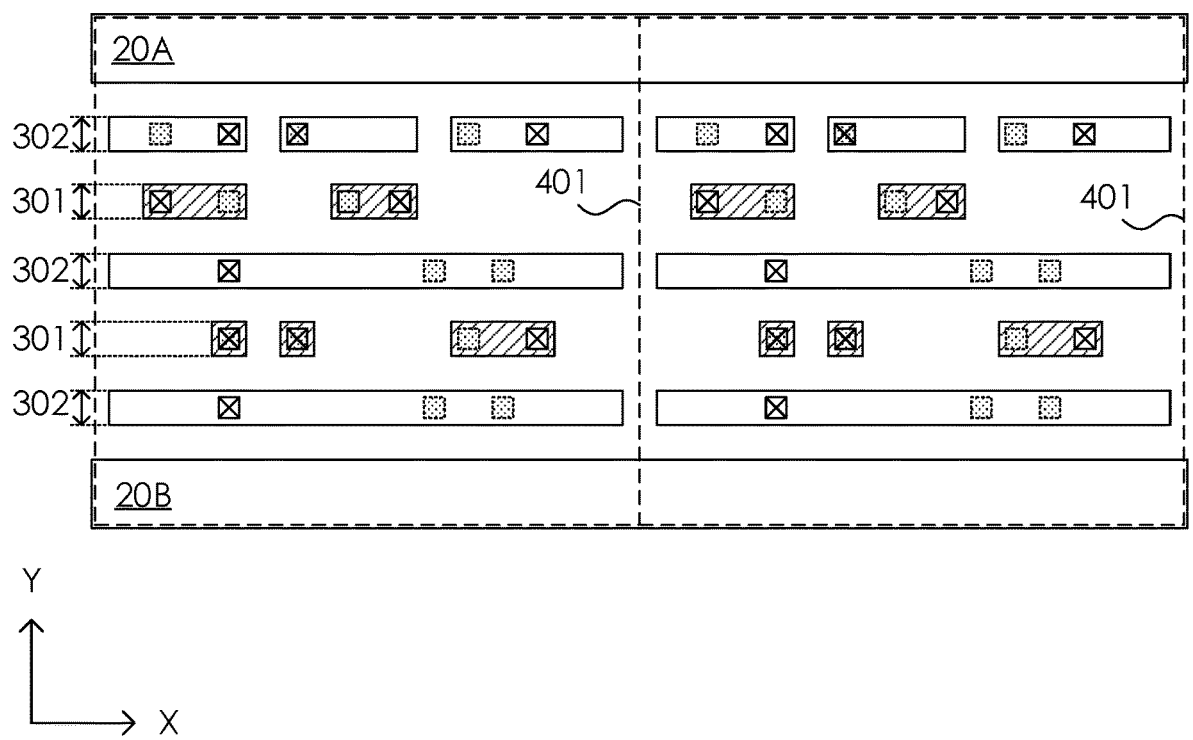
FIG. 3B illustrates a top view of a semiconductor structure according to some embodiments of the present disclosure.

As shown in FIG. 3B, in some embodiments, the numbers of the rows between the power rail 20A and the ground rail 20B may be different from that in the previously shown embodiments. That is, the numbers of the rows between the power rail 20A and the ground rail 20B may be altered depend on the dimension of the cell region 40 and the function requirement of the cell. For example, there are four rows of signal lines in the embodiment shown in FIG. 1, and one of the first row 301 may be entirely free from forming as shown in FIG. 3A since it is redundant/dummy; as shown in FIG. 3B, there are five rows of signal lines arranged between the power rail 20A and the ground rail 20B and be parallel thereto. In some embodiments, more than five rows of signal lines may be arranged between the power rail 20A and the ground rail 20B within each of the cell regions 40. Generally, the first rows 301 and the second rows 302 are alternately arranged between the power rail 20A and the ground rail 20B, but in the circumstances that one or more first rows 301 are originally should be formed due to self-aligned double patterning requirement, such first row(s) 301 of signal lines may be prevented to be formed according to the present disclosure, and therefore some of the adjacent second rows 302 can be free from having the first row 301 therebetween.

Figure 4:
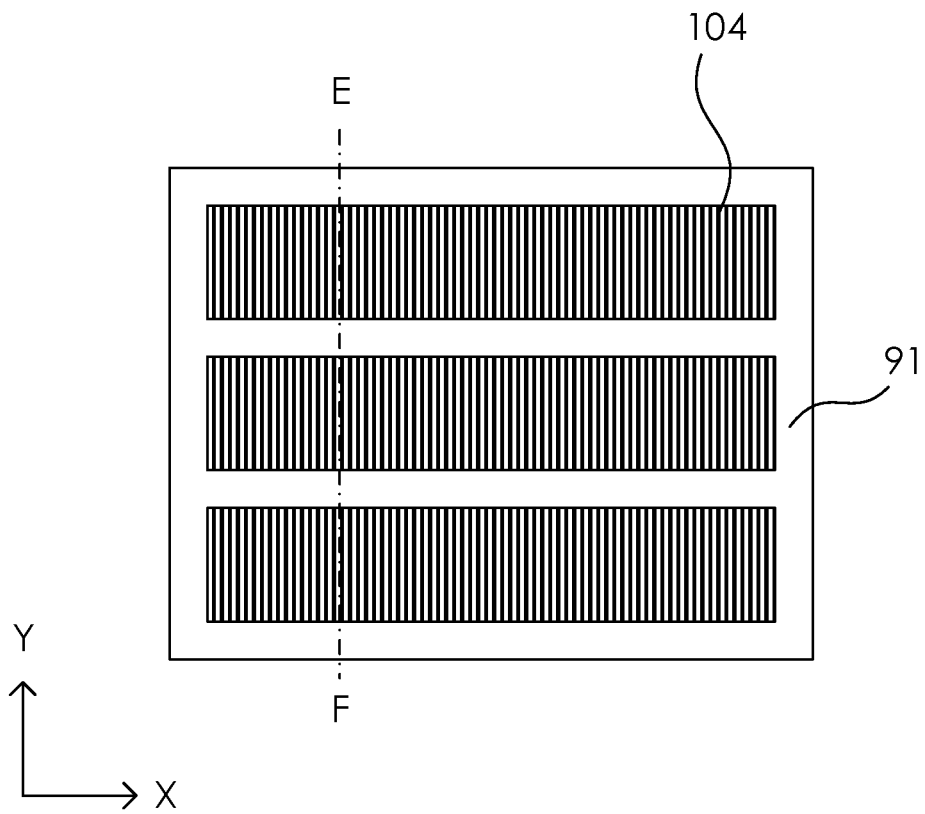
FIGS. 4 to 49 illustrate top views and cross-sectional views of forming a semiconductor structure according to some embodiments of the present disclosure.
Figure 5:
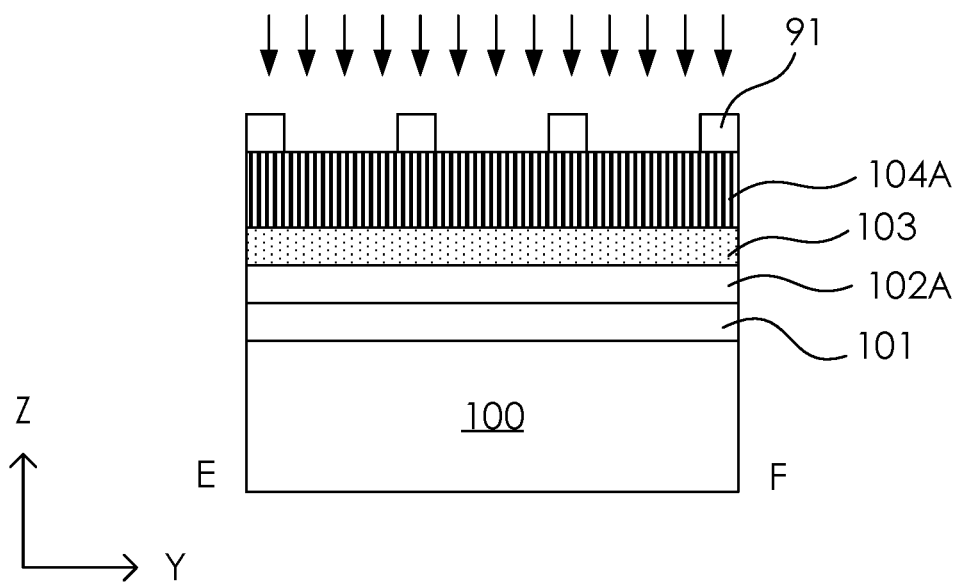

The forming of the semiconductor structure in the present disclosure may include various operations. As shown in FIGS. 4-49, the operations for forming the optimized signal lines that have a less parasitic capacitance in the semiconductor structure are disclosed. The embodiments shown in FIGS. 4-49 illustrate a cell region of a semiconductor structure, while the semiconductor structure may have two or more identical or different cell regions. Referring to FIGS. 4 and 5, wherein FIG. 5 is a cross-sectional view of FIG. 4 along line EF (and so do the rest of sectional views), in some embodiments, a substrate 100 with a FEOL structure (not shown in the figure) formed thereon may be provided or received. In some embodiments, a mid-end-of-line (MEOL) structure 101 may be formed over the FEOL structure. The MEOL structure 101 is formed by MEOL processes, for example, it is typically that gate via holes are etched in some areas that have dense vias and in some areas that have isolated vias.

In some embodiments, a dielectric layer 102A may be formed over the MEOL structure 101. The dielectric layer 102A may be an inter-metal dielectric (IMD) layer made by low-k dielectric materials for isolating the conductive lines or conductive vias within the metallization layer 102.

In some embodiments, a first hard mask layer 103 may be formed over the dielectric layer 102A. The first hard mask layer 103 may be dielectric and/or metal hard mask layers, or may be formed of suitable materials, such as, for example, conductive, semiconductive, or dielectric materials. A dielectric hard mask layer may be formed of silicon oxide, tetraethyl orthosilicate (TEOS), nitrogen-free anti-reflective coating (NFARC), silicon carbide, silicon oxynitride, or the like. The formation methods may include PECVD, high-density plasma (HDP) deposition, a spin-on process, the like, or a combination thereof. A metal hard mask layer may comprise titanium, tantalum, titanium nitride, tantalum nitride, or the like. The formation methods may include suitable blanket deposition techniques, such as physical vapor deposition (PVD), radio frequency PVD (RFPVD), atomic layer deposition (ALD), the like, or a combination thereof.

In some embodiments, a mandrel layer 104A may be formed over the first hard mask layer 103. The mandrel layer 104A may have a multi-layer structure or be a single layer of a single material. For example, the mandrel layer 104A may be an organosilicate polymer layer formed by spin coating. In another example, the mandrel layer 104A may be an amorphous silicon mandrel layer form by chemical vapor deposition (CVD).

As shown in FIGS. 4 and 5, a first photoresist layer 91 may be disposed over the mandrel layer 104A for patterning the mandrel layer 104A. The first photoresist layer 91 is a photoresist material. By photolithography, the first photoresist layer 91 is patterned as shown in FIG. 4, and further referring to FIGS. 6 and 7, through an etching operation, the pattern of the first photoresist layer 91 is transferred to the mandrel layer 104A, and a plurality of mandrels 104 are formed accordingly. In some embodiments, the top surface of the mask layer 103 may be exposed accordingly. As shown in FIG. 7, the first photoresist layer 91 can be removed after patterning the mandrel layer 104A.

Figure 6:
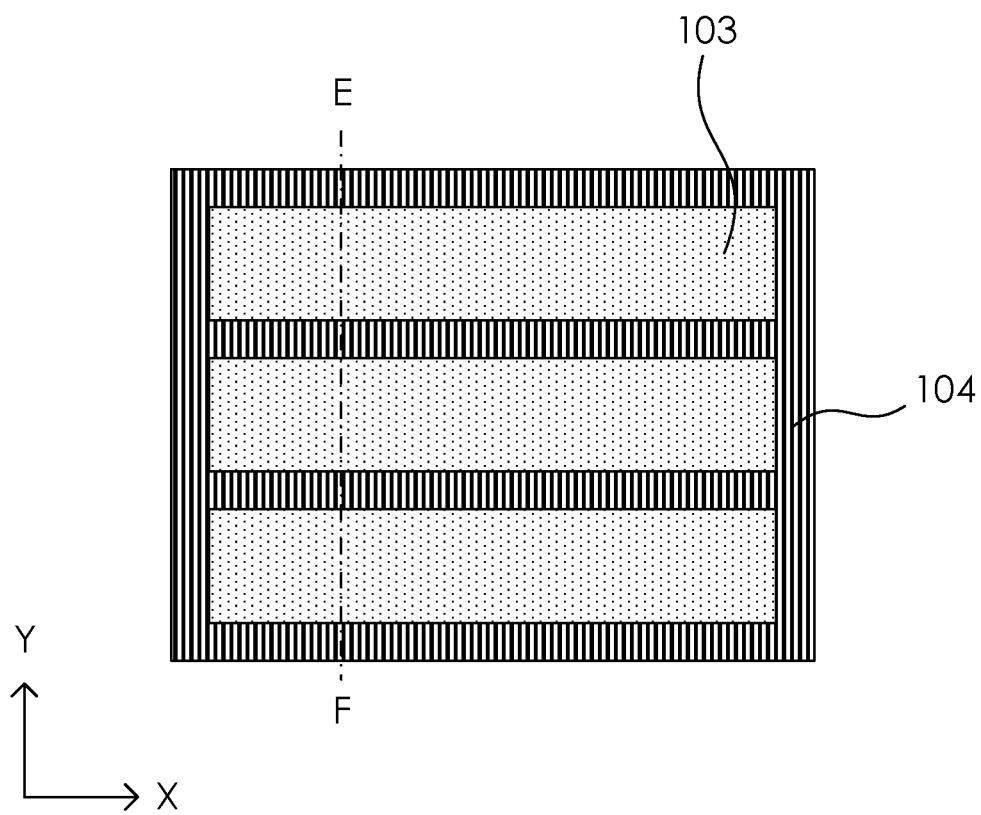
Figure 7:
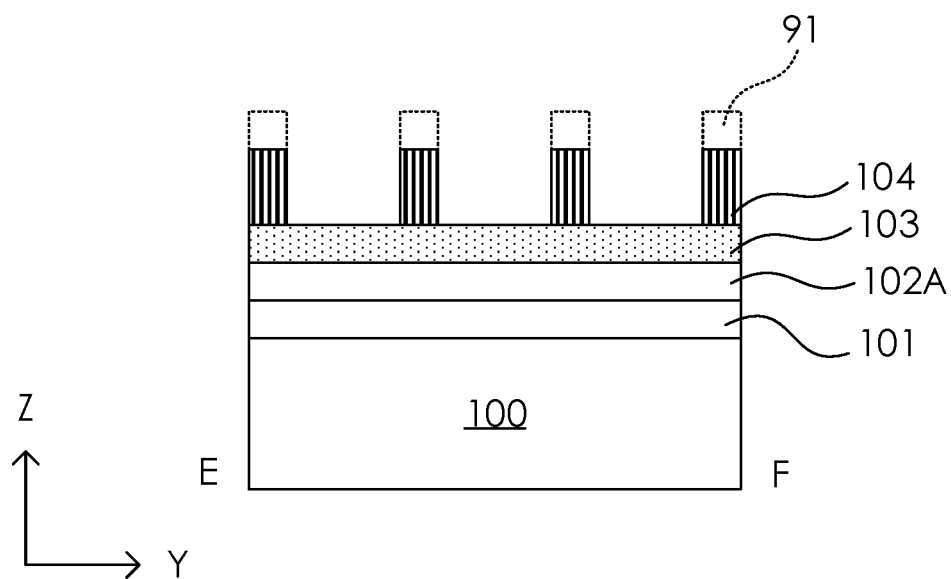
Figure 8:
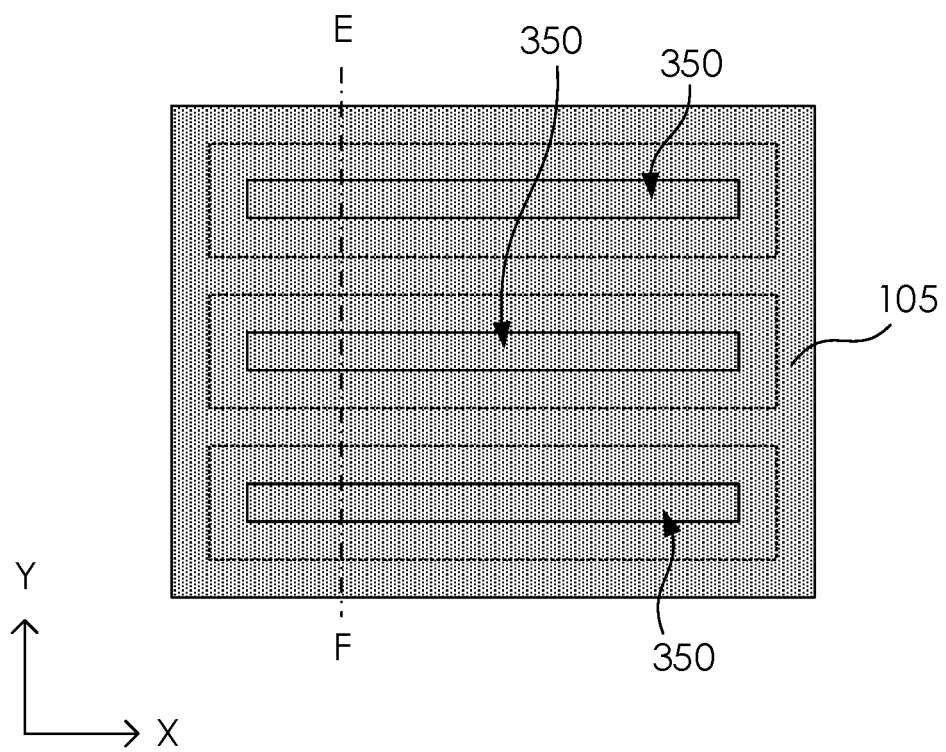
Figure 9:
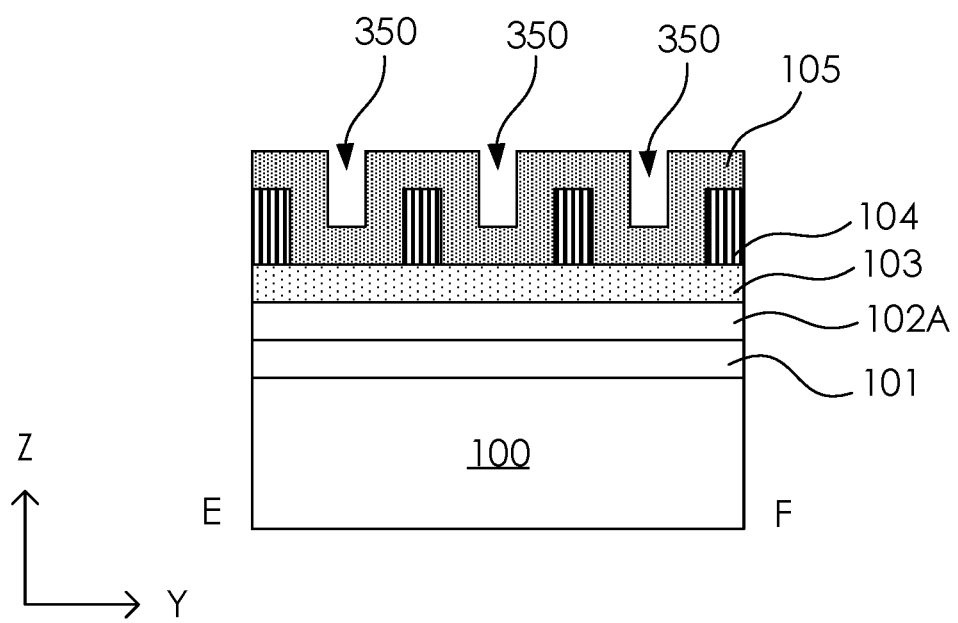

In the scenario that three first rows 301 are included within the cell region, there may have three block patterns within such cell region as shown in FIG. 6. Therefore, as shown in FIGS. 8 and 9, after forming a spacer layer 105 over the mandrels 104, because the spacer layer 105 is formed as a conformal layer over the mandrels 104 and over bottoms and sidewalls of the first openings enclosed by the mandrels 104, a plurality of trenches 350 may be formed due to the profile of the spacer layer 105. The trenches 350 are the structures for forming the first rows 301 of signal lines, and the signal lines thereof may be separated by modifying the profile of the trenches, which will be described later.

Figure 10:
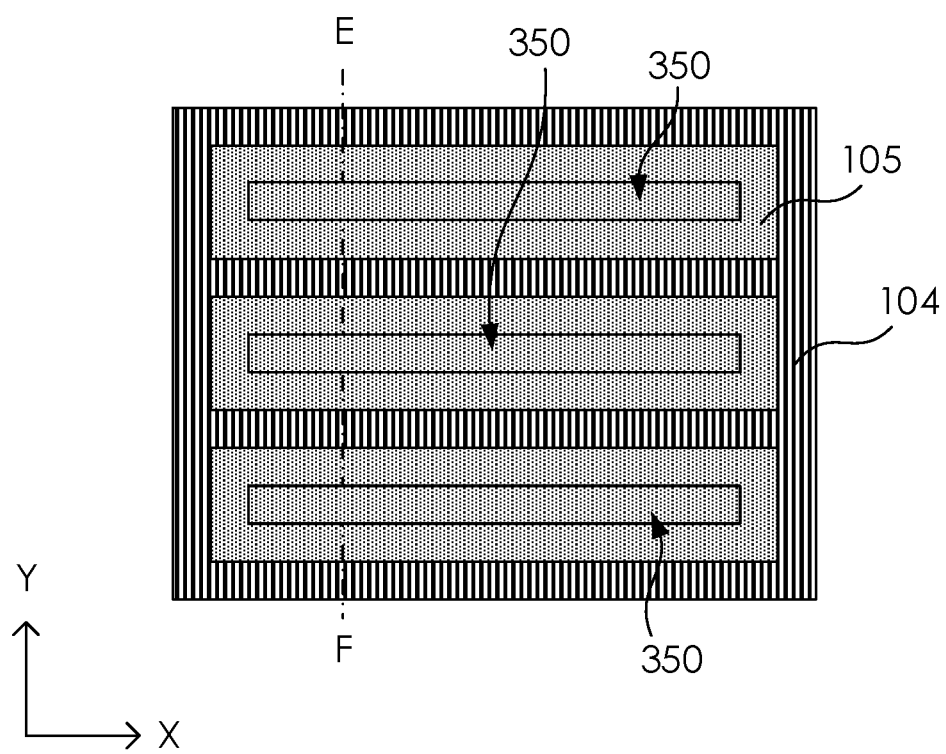
Figure 11:
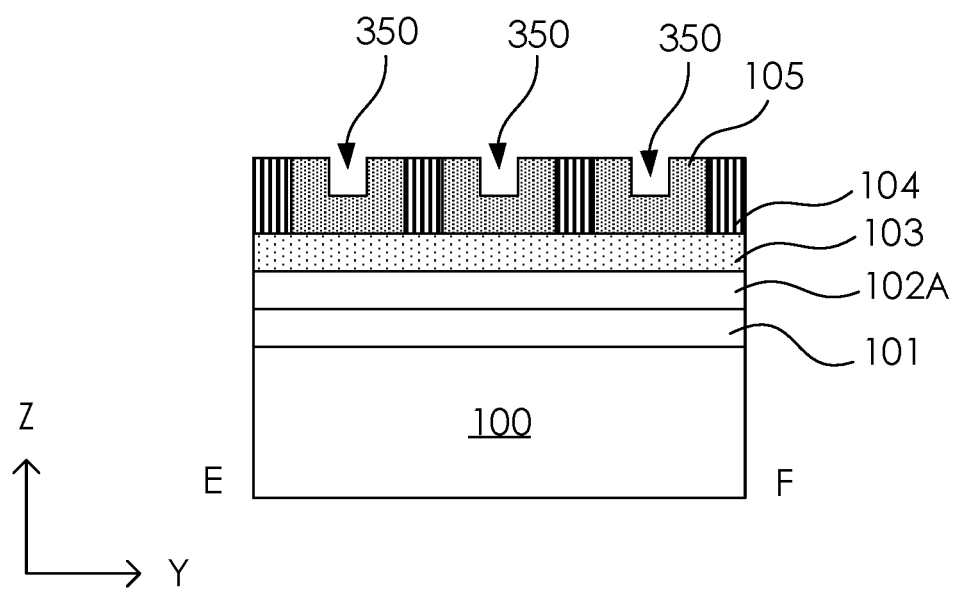

As shown in FIGS. 10 and 11, in some embodiments, the spacer layer 105 is planarized to expose the top surfaces of the mandrels 104. The spacer layer 105 may be planarized by a chemical mechanical polishing (CMP) operation. The depth of the trench 350 may be reduced accordingly, but these trenches are not vanished through the CMP operation since the bottom surface of each of the trenches 350 is lower than the top surfaces of the mandrels 104.

Figure 12:
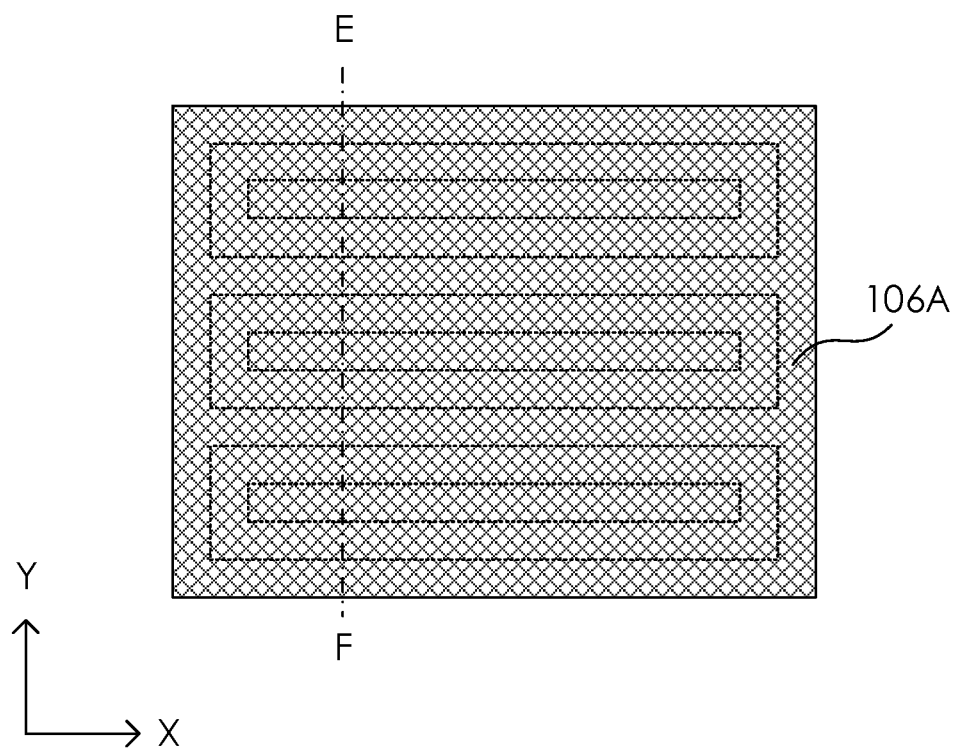
Figure 13:
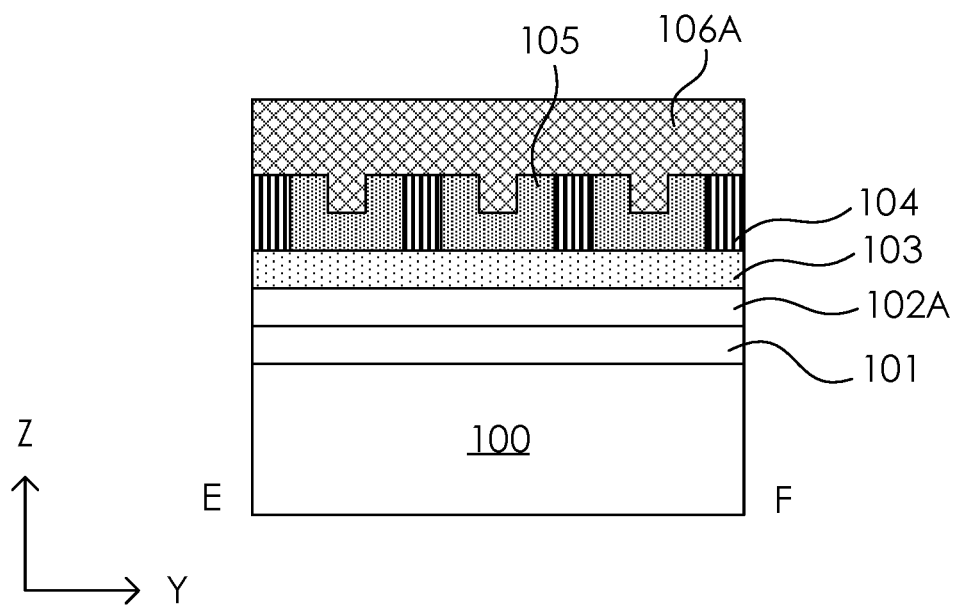

As shown in FIGS. 12 and 13, in some embodiments, a first bottom layer 106A may be formed over the mandrels 104 and the spacer layer 105, and thus the trenches 350 are entirely filled by the first bottom layer 106A. In some embodiments, the first bottom layer 106A is polymer. In some embodiments, the first bottom layer 106A may further include silicon. In some embodiments, the silicon concentration in the polymer may decrease with the depth of the first bottom layer 106A.

Figure 14:
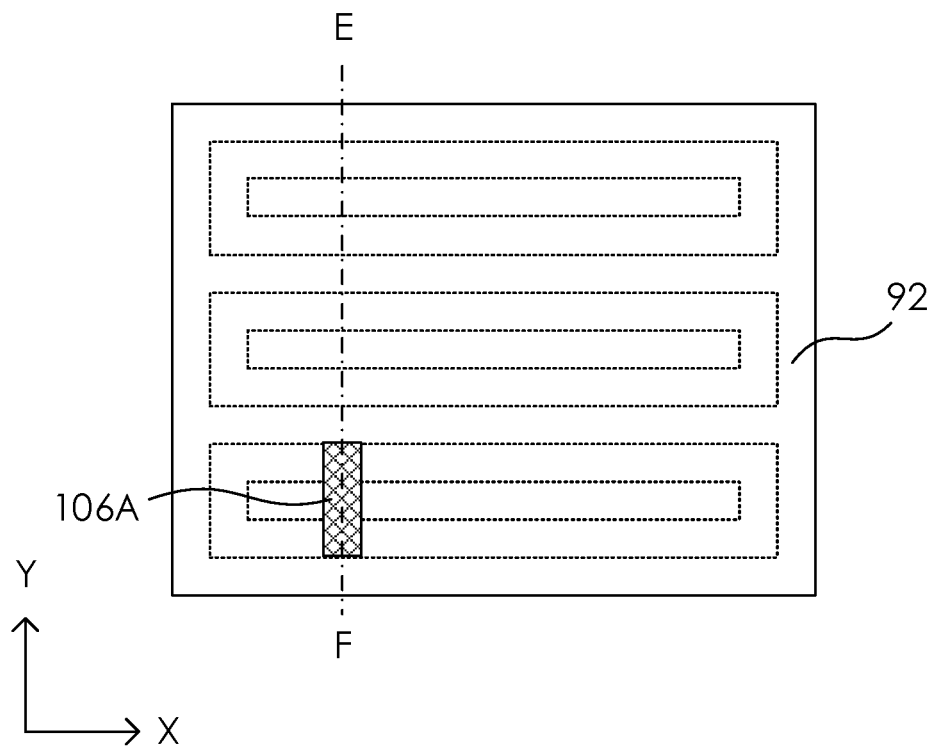
Figure 15:
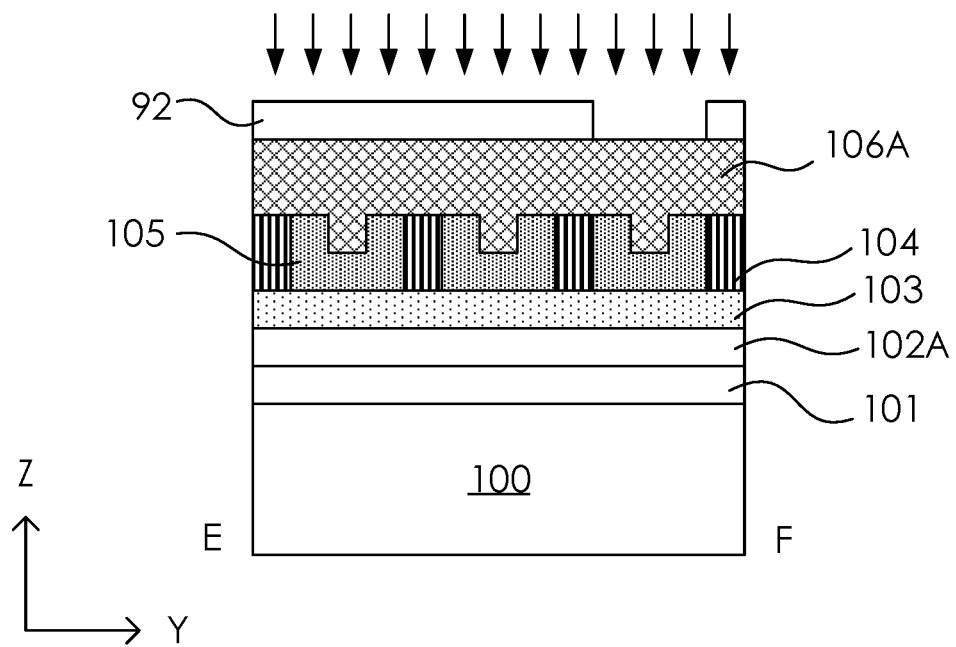

As shown in FIGS. 14 and 15, in some embodiments, a second photoresist layer 92 may be disposed over the first bottom layer 106A for patterning the first bottom layer 106A. The second photoresist layer 92 is a photoresist material. By photolithography, the second photoresist layer 92 is patterned as shown in FIG. 14. The second photoresist layer 92 is patterned by a first lithography mask (not shown in the figure), wherein the first lithography mask is designed to isolate or to break the signal lines within the first rows 301. That is, by using the first lithography mask (or the patterned second photoresist layer 92), the signal lines formed through the later depositing operations may have two or more sections in a row, such as the first rows 301 previously shown in FIGS. 1, 3A, and 3B. In other words, the second photoresist layer 92 is for forming the pattern of the first bottom layer 106A to isolate or to break the signal lines within the first rows 301. Note the patterns illustrate in FIGS. 14 and 15 are for exemplary purposes, it is possible to pattern more positions of first bottom layer 106A depend on the cutting designs of the signal lines.

Figure 16:
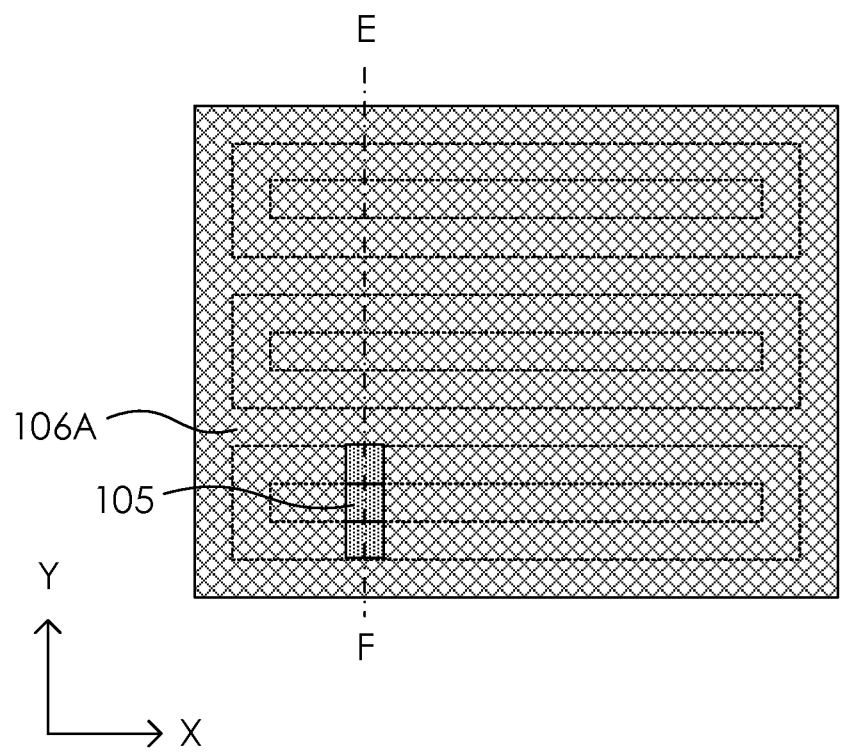
Figure 17:
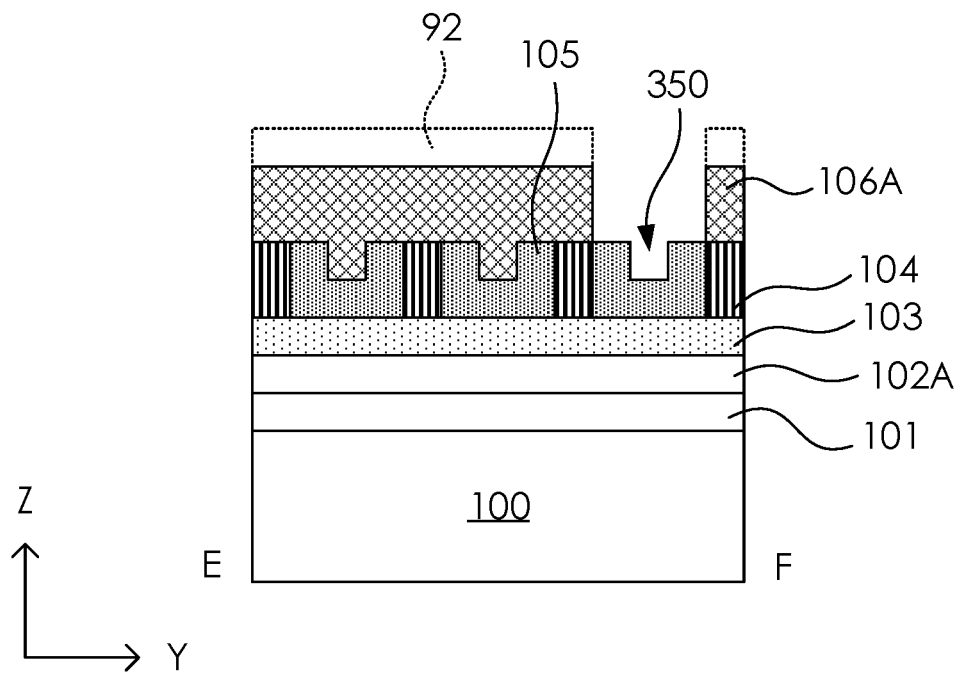

As shown in FIGS. 16 and 17, in some embodiments, through an etching operation, the pattern of the second photoresist layer 92 is transferred to the first bottom layer 106A. In some embodiments, the top surface of a portion of the spacer layer 105 may be exposed accordingly, while such portion at least includes a trench 350 therein. In other words, at least a trench 350 is exposed from the first bottom layer 106A through the etching operation. As shown in FIG. 17, the second photoresist layer 92 can be removed after patterning the first bottom layer 106A.

Figure 18:
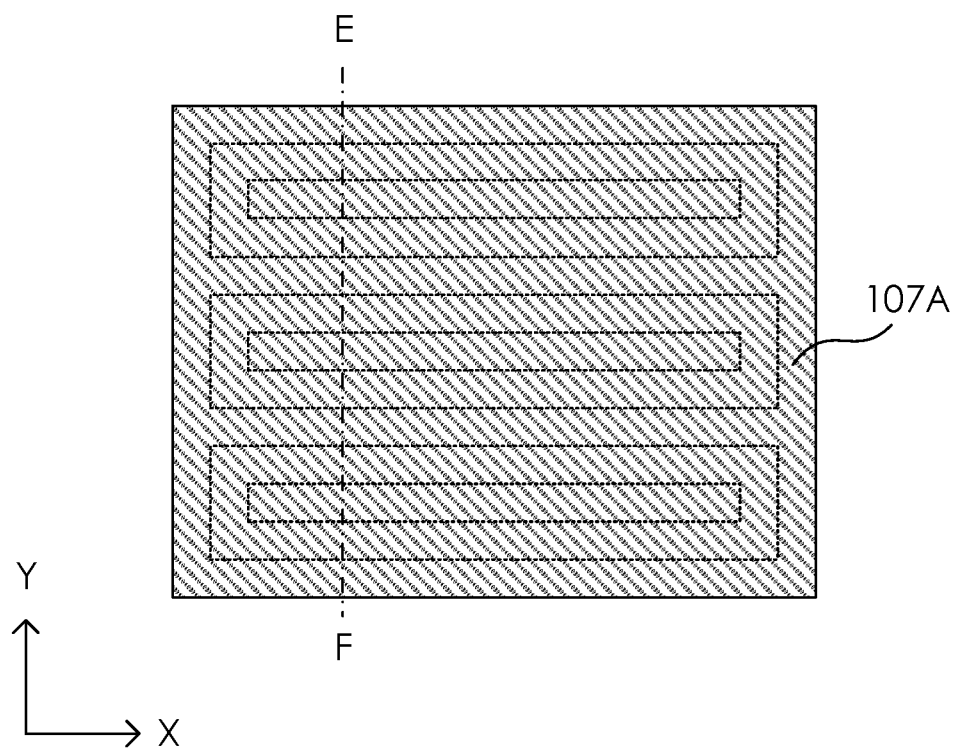
Figure 19:
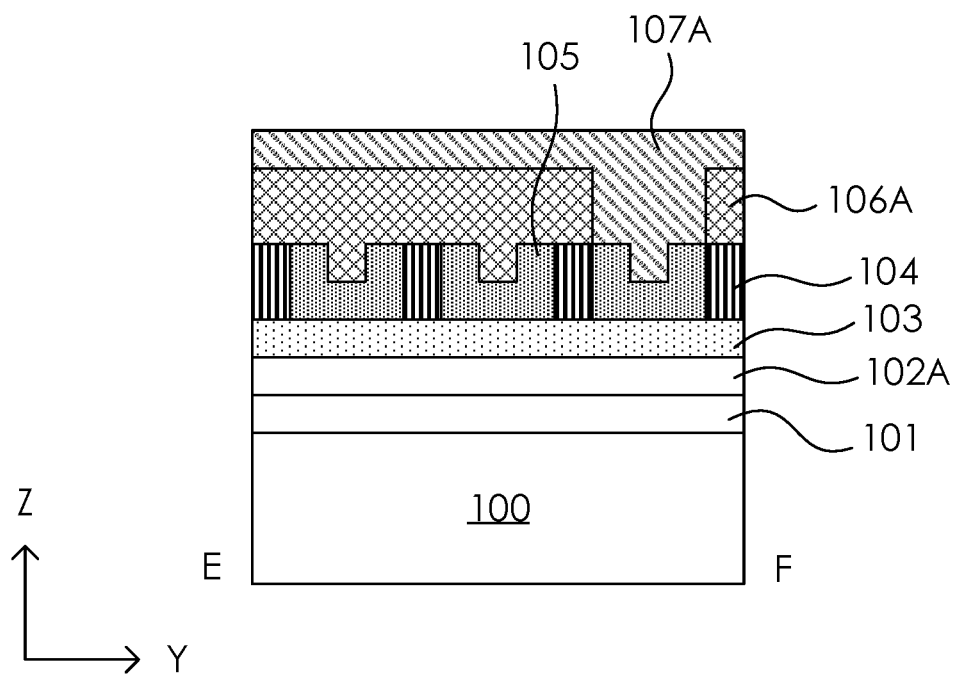

As shown in FIGS. 18 and 19, in some embodiments, a first block material 107A may be formed over the patterned first bottom layer 106A and at least filled the exposed trench 350. The first block material 107A may be applied as a second hard mask layer. The second hard mask layer may be dielectric and/or metal hard mask layers, or may be formed of suitable materials, such as, for example, conductive, semiconductive, or dielectric materials. In some embodiments, the material of the first block material 107A may be identical to that of the first hard mask layer 103.

Figure 20:
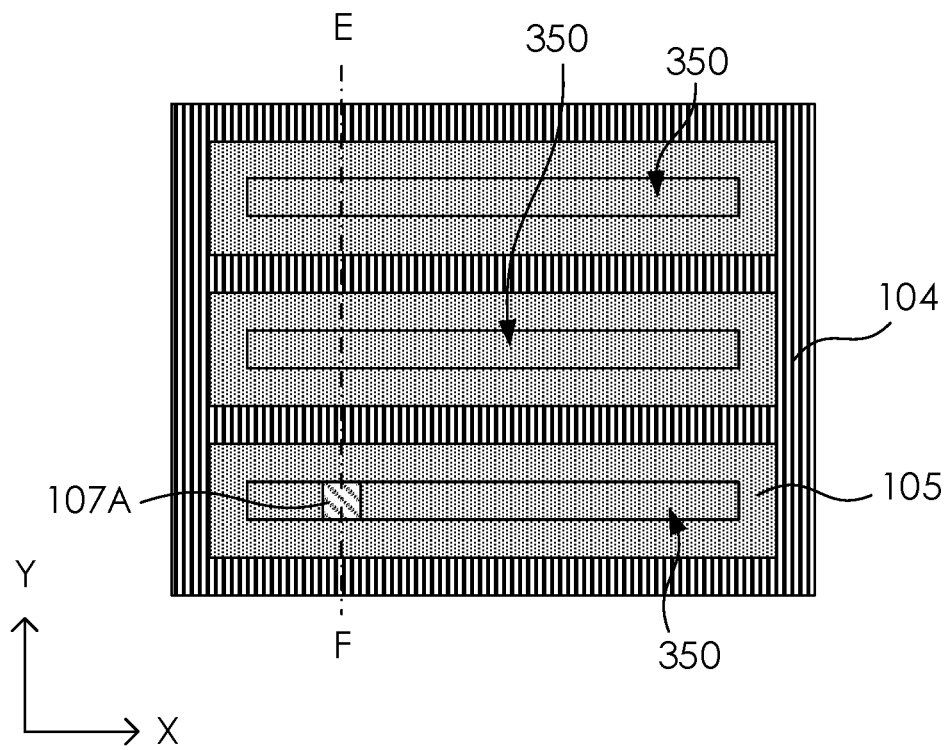
Figure 21:
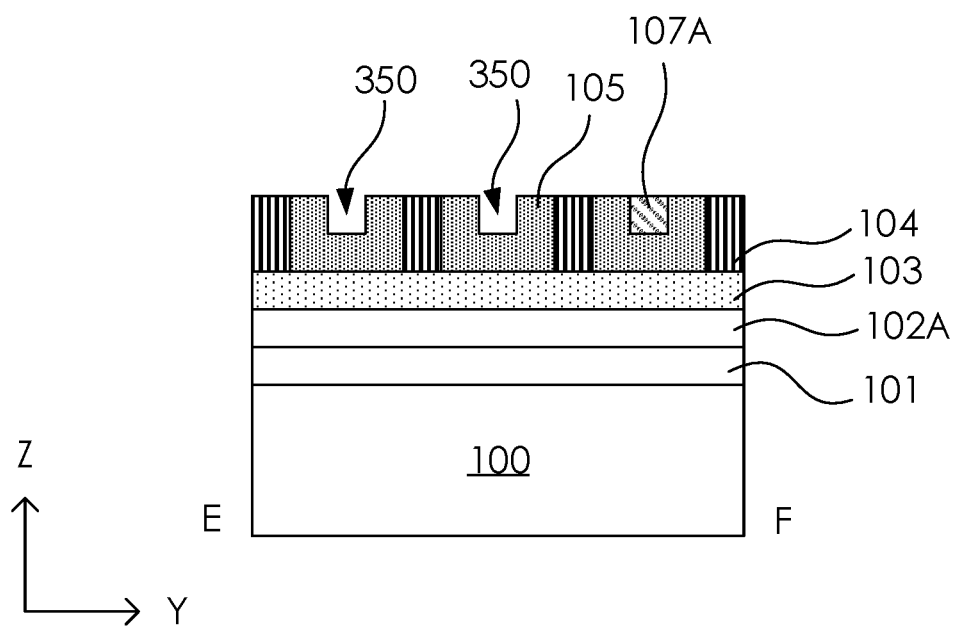

As shown in FIGS. 20 and 21, in some embodiments, the first block material 107A may be removed except the portion filled in the trench 350. The first block material 107A may be removed by a planarization operation. Similarly, the first bottom layer 106A may also be removed by the planarization operation. In some alternative embodiments, the first bottom layer 106A may be removed entirely through an etching operation. As shown in FIG. 21, in the scenario that the first bottom layer 106A is removed entirely, the trenches 350 used to be filled by the first bottom layer 106A may be exposed.

In order to further remove the signal lines in the redundant/dummy rows, or to remove the redundant/dummy rows entirely to reducing the parasitic capacitance, the present disclosure may use an additional lithography mask other than the first lithography mask (i.e., the lithography mask to pattern the second photoresist layer 92), as well as an additional patterning operation accordingly to prevent the formation of the above-mentioned portions. That is, under the self-aligned double patterning technique, the present disclosure may specifically modify the length of the signal lines belong to the first rows. On the other hand, the present disclosure may simply implement such modification by using an additional lithography mask, instead of changing the patterns of the original one. In other words, the present disclosure may provide an option to optimize the performance of the semiconductor structure by using such additional lithography mask.

Figure 22:
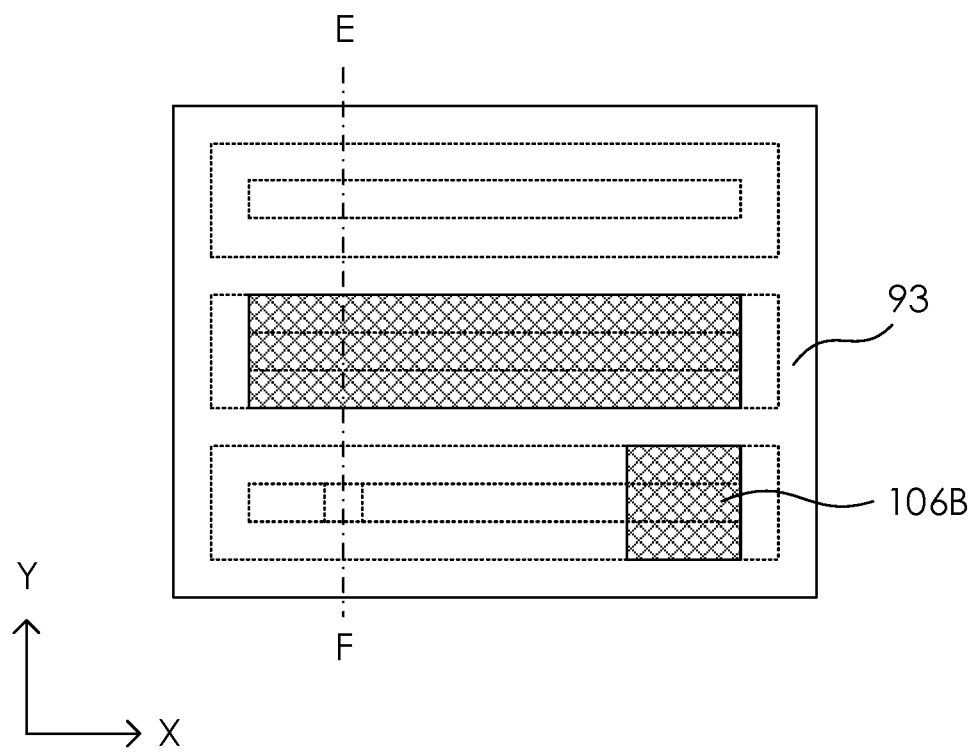
Figure 23:
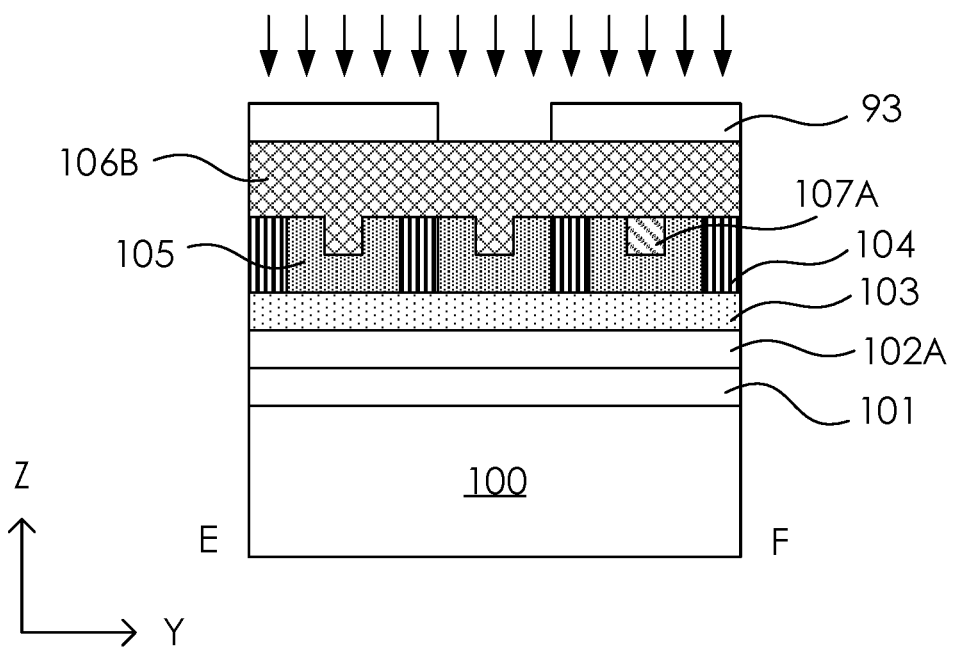

As shown in FIGS. 22 and 23, in some embodiments, a second bottom layer 106B may be formed over the mandrels 104, the spacer layer 105, and the first block material 107A, and thus the exposed trenches 350 are entirely filled by the second bottom layer 106B. In some embodiments, the second bottom layer 106B is polymer. In some embodiments, the second bottom layer 106B may further includes silicon. In some embodiments, the silicon concentration in the polymer may decrease with the depth of the second bottom layer 106B. In some embodiments, the material of the second bottom layer 106B is identical to that of the first bottom layer 106A.

Still referring to FIGS. 22 and 23, in some embodiments, a third photoresist layer 93 may be disposed over the second bottom layer 106B for patterning the second bottom layer 106B. The third photoresist layer 93 is a photoresist material. By photolithography, the third photoresist layer 93 is patterned as shown in FIG. 22. The third photoresist layer 93 is patterned by a second lithography mask (not shown in the figure), which is the additional lithography mask previously mentioned in describing FIGS. 14 and 15. The second lithography mask is designed to broaden the areas that free from forming the signal lines within the first rows 301. That is, in some embodiments, the second lithography mask is solely designed to prevent the forming of redundant/dummy signal lines, or the redundant/dummy portions of the conventional signal lines. Accordingly, by using the second lithography mask (or the patterned third photoresist layer 93), the signal lines formed through the later depositing operations may have less redundant/dummy portions, and therefore the parasitic capacitance issues induced by the signal lines in the semiconductor structure may be alleviated. In other words, the third photoresist layer 93 is for forming the pattern of the second bottom layer 106B to shorten the signal lines within the first rows 301 (e.g., the second bottom layer 106B in the lower right portion of FIG. 22), or to entirely prevent the formation of at least one of the first rows 301 (e.g., the portion of the second bottom layer 106B in the center of FIG. 22). Note the patterns illustrate in FIGS. 22 and 23 are for exemplary purposes, it is possible to pattern more positions of second bottom layer 106B depend on the arrangement of the real signal lines.

Figure 24:
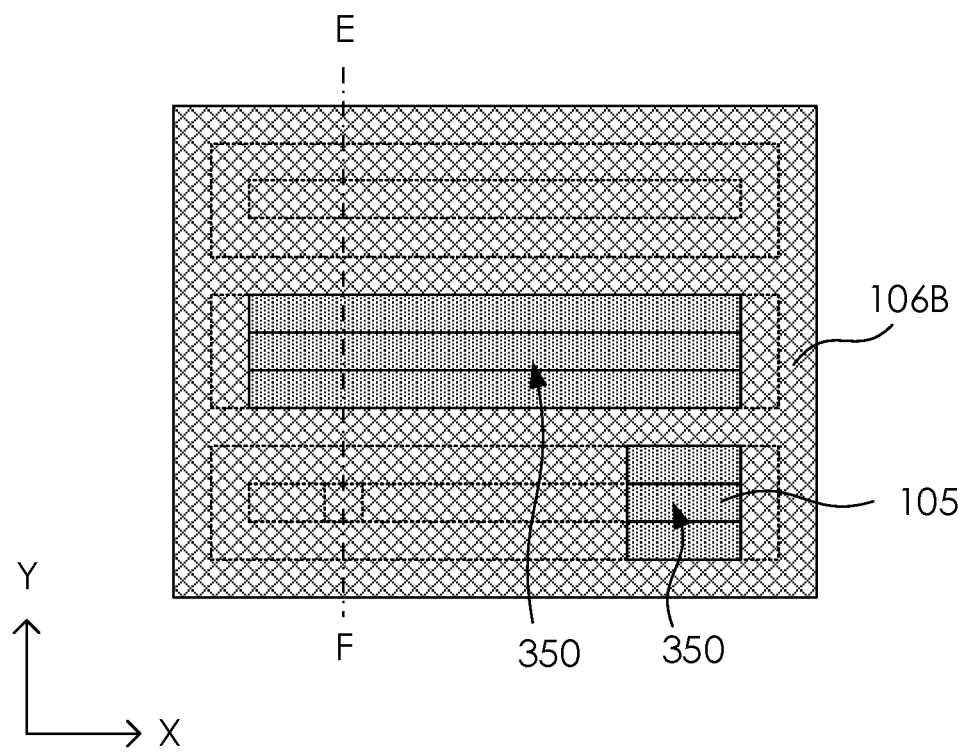
Figure 25:
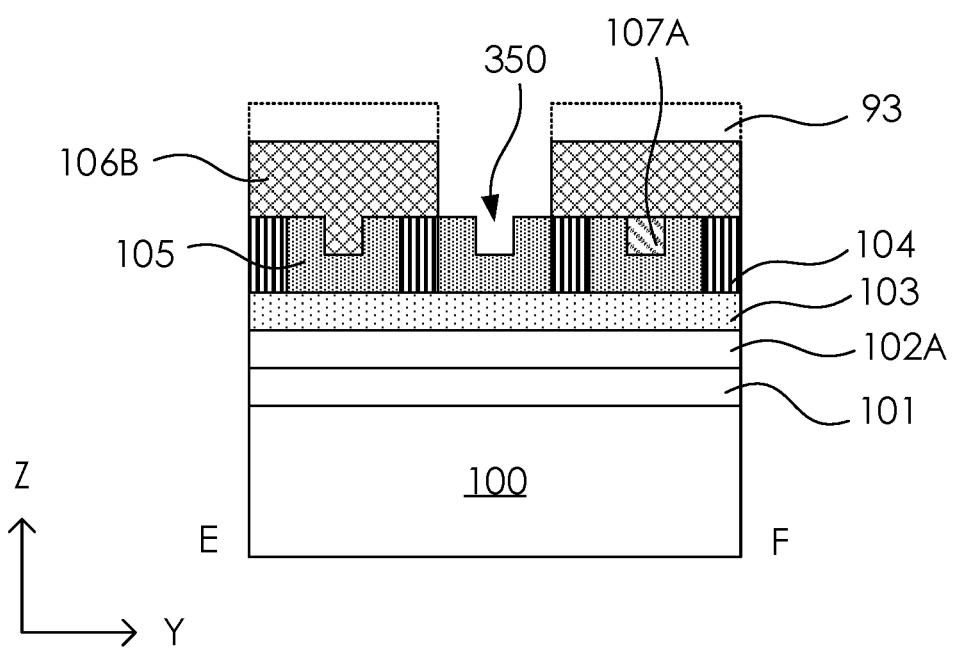

As shown in FIGS. 24 and 25, in some embodiments, through an etching operation, the pattern of the third photoresist layer 93 is transferred to the second bottom layer 106B. In some embodiments, the top surface of a portion of the spacer layer 105 may be exposed accordingly, while such portion at least includes a trench 350 therein. In other words, at least a trench 350 is exposed from the second bottom layer 106B through the etching operation. As shown in FIG. 25, the second photoresist layer 92 can be removed after patterning the second bottom layer 106B.

Figure 26:
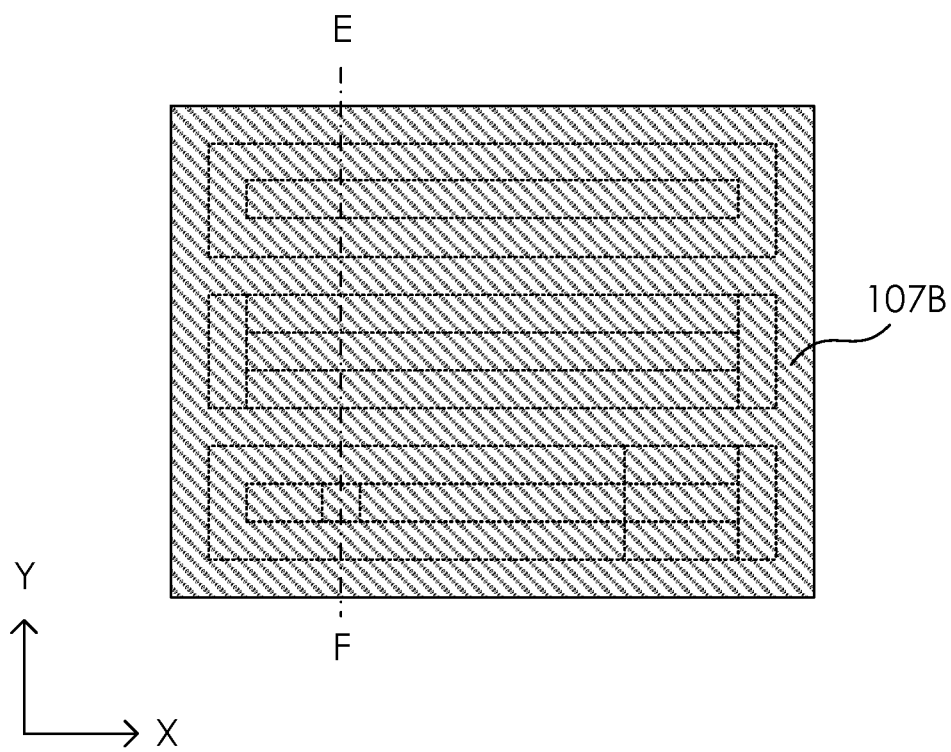
Figure 27:
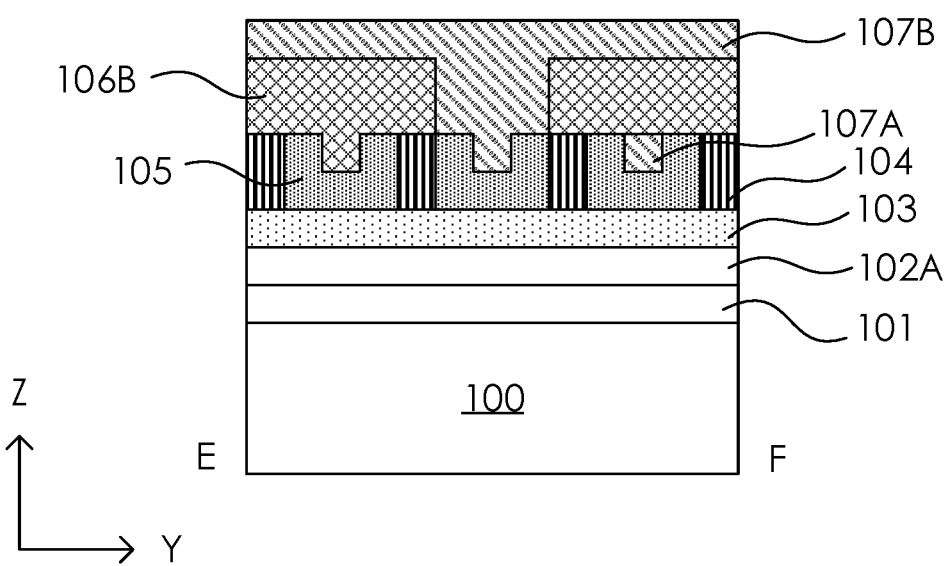

As shown in FIGS. 26 and 27, in some embodiments, a second block material 107B may be formed over the patterned second bottom layer 106B and at least filled a portion of the exposed trench 350. The second block material 107B may be applied as a third hard mask layer. The third hard mask layer may be dielectric and/or metal hard mask layers, or may be formed of suitable materials, such as, for example, conductive, semiconductive, or dielectric materials. In some embodiments, the material of the second block material 107B may be identical to that of the first block material 107A or the hard mask layer 103. Generally, since the second block material 107B is formed to shorten the redundant/dummy portions of the signal lines within the first rows instead of solely to cut the signal lines, a width of the second block material 107B (or a width of the portion of the trench filled by the second block material 107B) is greater than a width of the first block material 107A (or a width of the portion of the trench filled by the first block material 107A).

Figure 28:
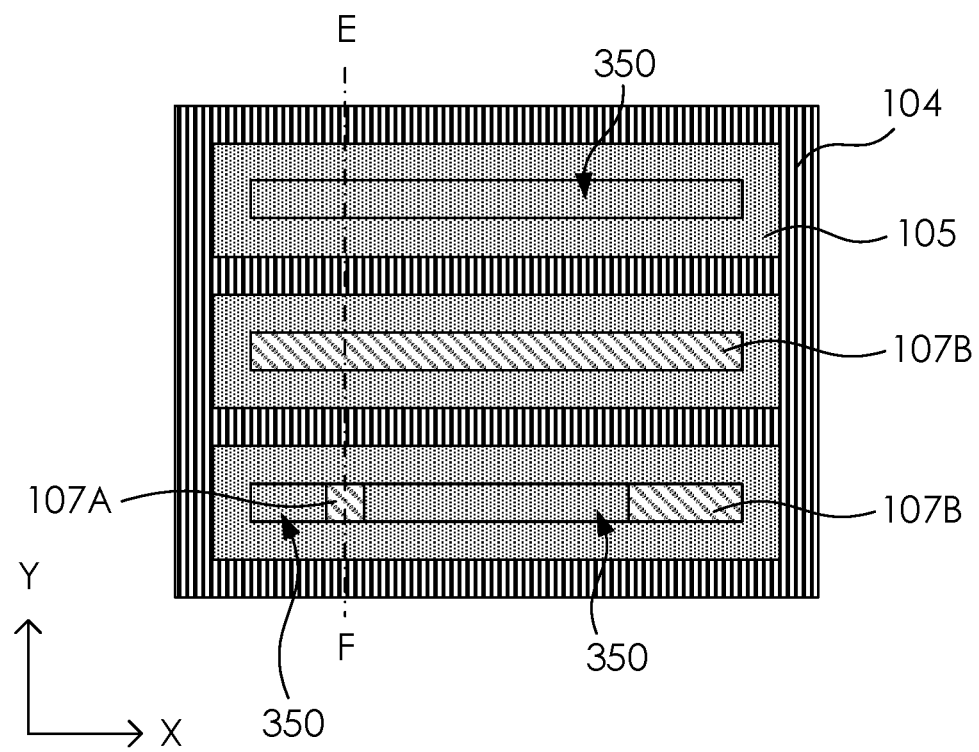
Figure 29:
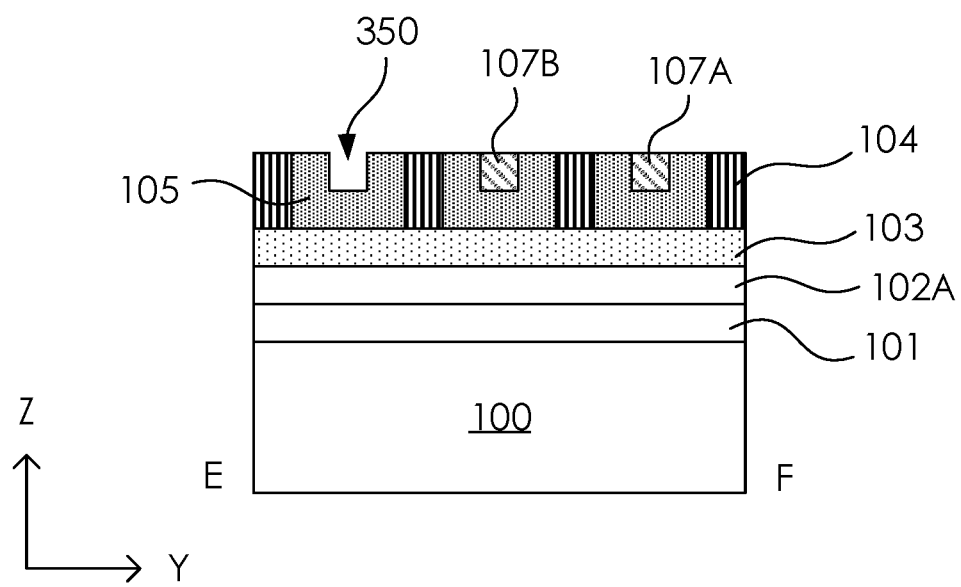

As shown in FIGS. 28 and 29, in some embodiments, the second block material 107B may be removed except the portion filled in the trench 350. The second block material 107B may be removed by a planarization operation. Similarly, the second bottom layer 106B may also be removed by the planarization operation. In some alternative embodiments, the second bottom layer 106B may be removed entirely through an etching operation. As shown in FIG. 29, since the second bottom layer 106A is removed entirely in this operation, the trenches 350 that free from filled with the first block material 107A or the second block material 107B can be exposed. Referring to FIG. 28, it is clear that the first block material 107A and the second block material 107B may occupy different portions of the trenches 350. The occupied portions of the trenches 350 may prevent the forming of signal lines, and the distances between the signal lines are substantially determined by the lengths of the first block material 107A and the second block material 107B.

Figure 30:
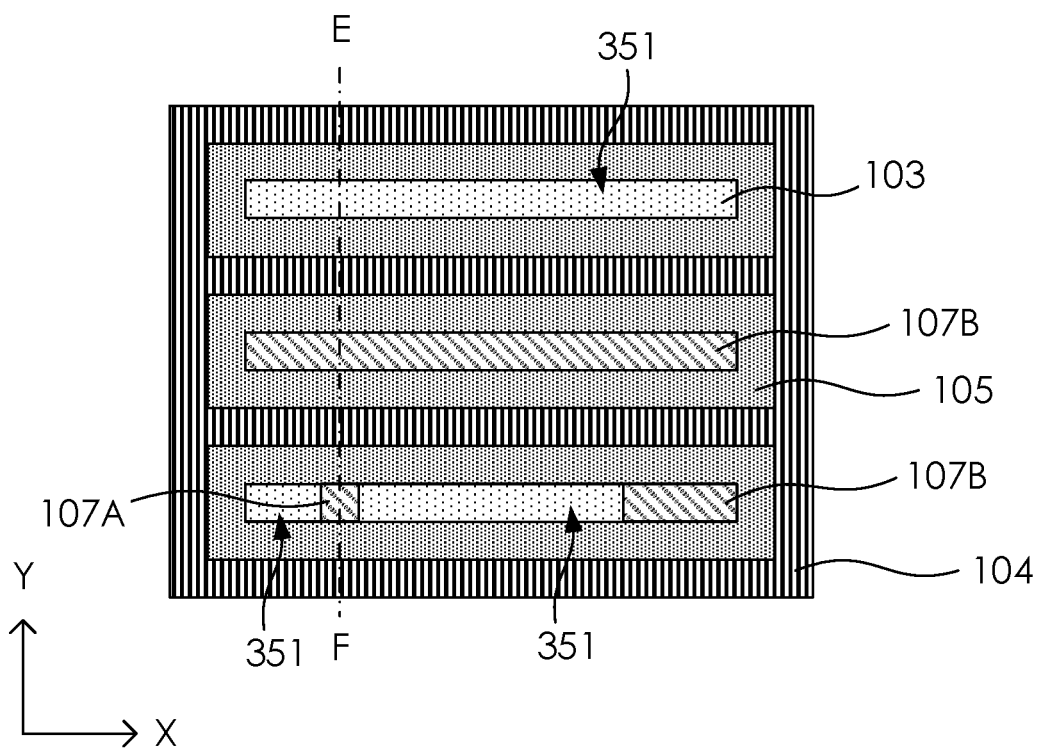
Figure 31:
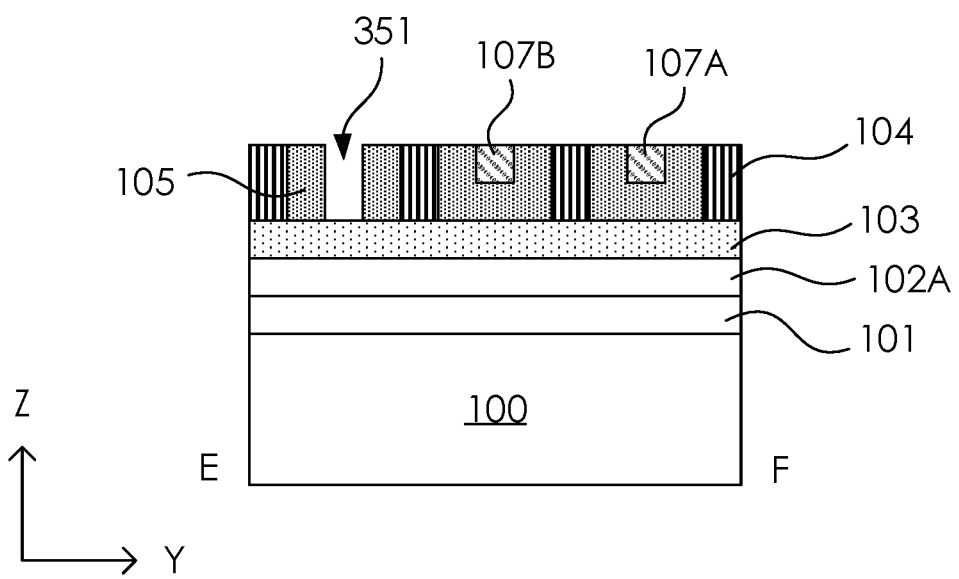

As shown in FIGS. 30 and 31, in some embodiments, the spacer layer 105 under the exposed trenches 350 may be etched to expose the top surface of the hard mask layer 103. Accordingly, the exposed trenches 350 are changed to first openings 351 of the spacer layer 105. To perform the etching operation, a photoresist layer may be applied, while the photoresist layer may not be specifically match with the pattern of the second lithography mask. That is, in some embodiments of the present disclosure, only one additional lithography mask (i.e., the second lithography mask as previously mentioned) is prepared to optimize the performance of the semiconductor structure.

Figure 32:
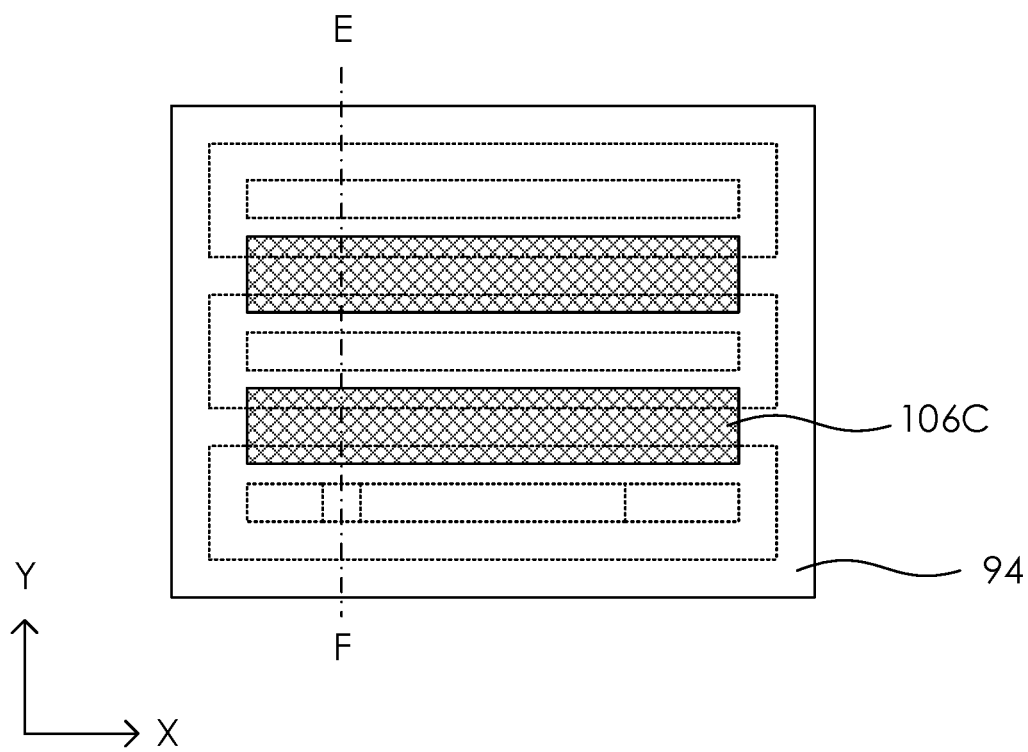
Figure 33:
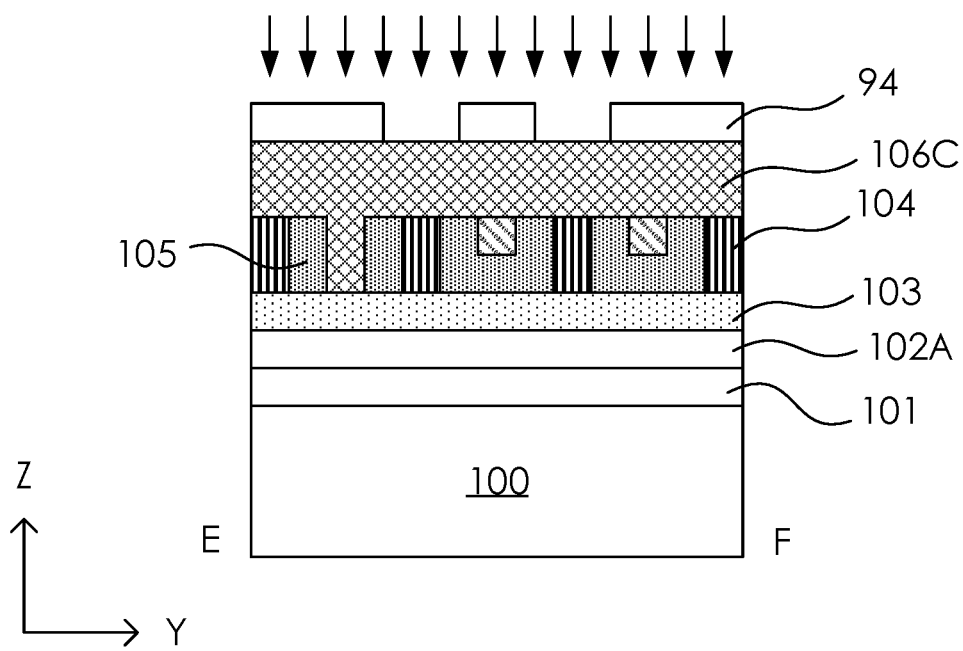

As shown in FIGS. 32 and 33, in some embodiments, a third bottom layer 106C may be formed over the mandrels 104, the spacer layer 105, the first block material 107A, and the second block material 107B, and thus the first openings 351 are entirely filled by the third bottom layer 106C. In some embodiments, the third bottom layer 106C is polymer. In some embodiments, the third bottom layer 106C may further include silicon. In some embodiments, the silicon concentration in the polymer may decrease with the depth of the third bottom layer 106C.

Still referring to FIGS. 32 and 33, in some embodiments, a fourth photoresist layer 94 may be disposed over the third bottom layer 106C for patterning the third bottom layer 106C and removing a portion of the mandrels 104. The fourth photoresist layer 94 is a photoresist material. By photolithography, the fourth photoresist layer 94 is patterned as shown in FIG. 32, and further referring to FIGS. 34 and 35, through an etching operation, the pattern of the fourth photoresist layer 94 is transferred to the third bottom layer 106C, and the mandrels 104 directly below the third bottom layer 106C is removed as well. Accordingly, one or more second openings 352 of the spacer layer 105 are formed and the top surface of the first hard mask layer 103 is exposed. As shown in FIG. 35, the fourth photoresist layer 94 can be removed after patterning the third bottom layer 106C.

Figure 34:
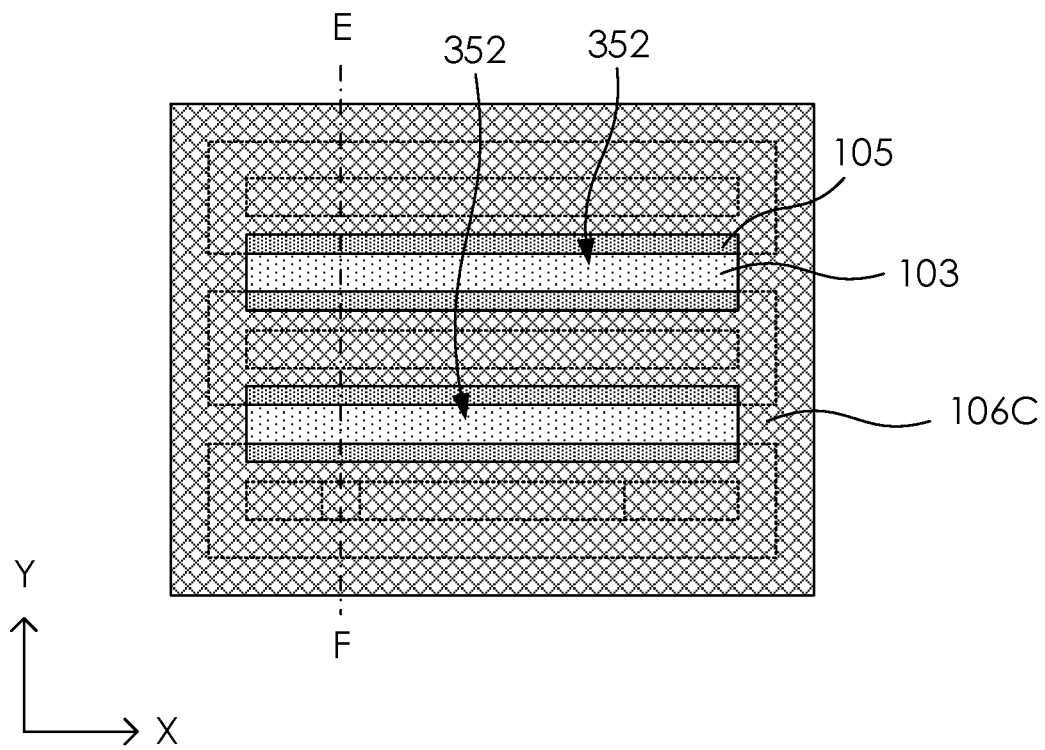
Figure 35:
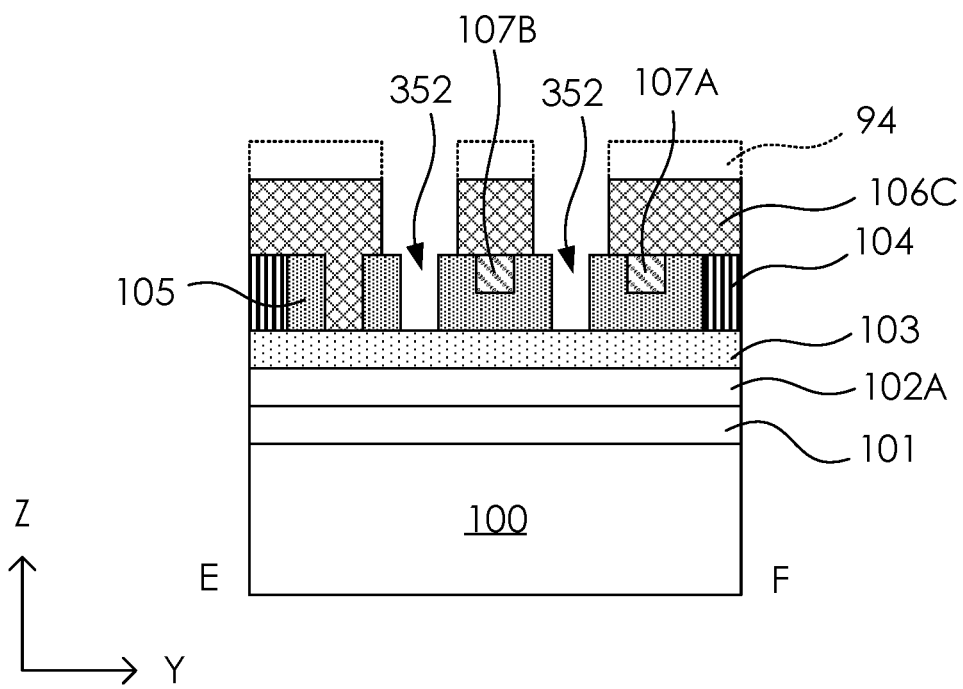
Figure 36:
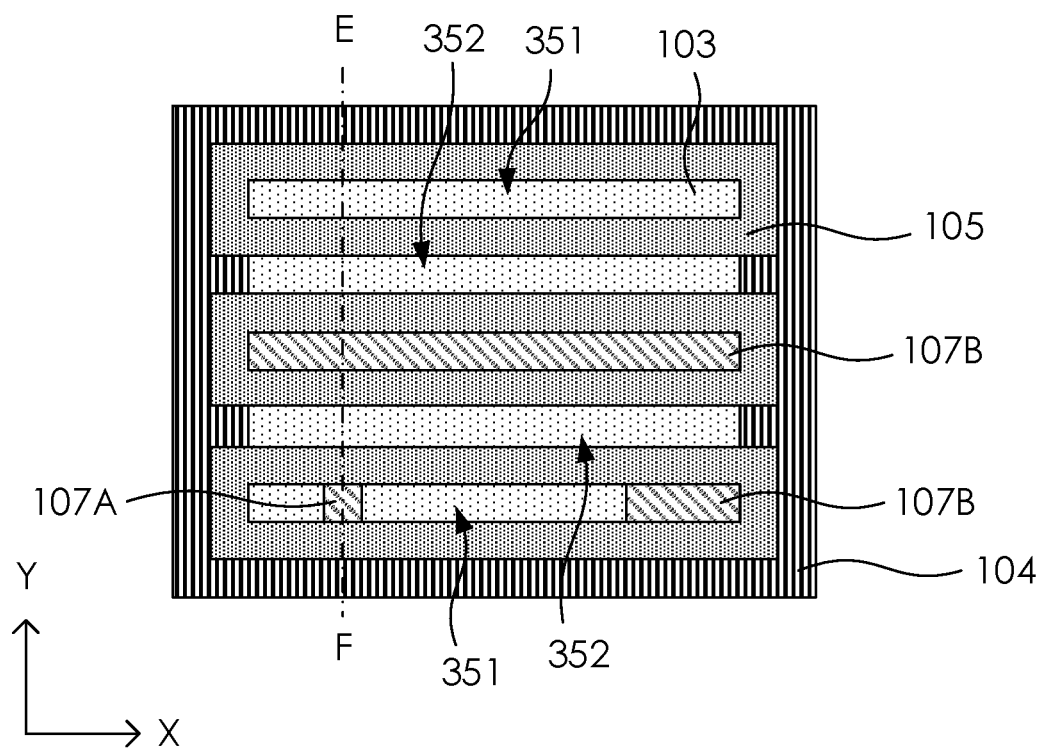
Figure 37:
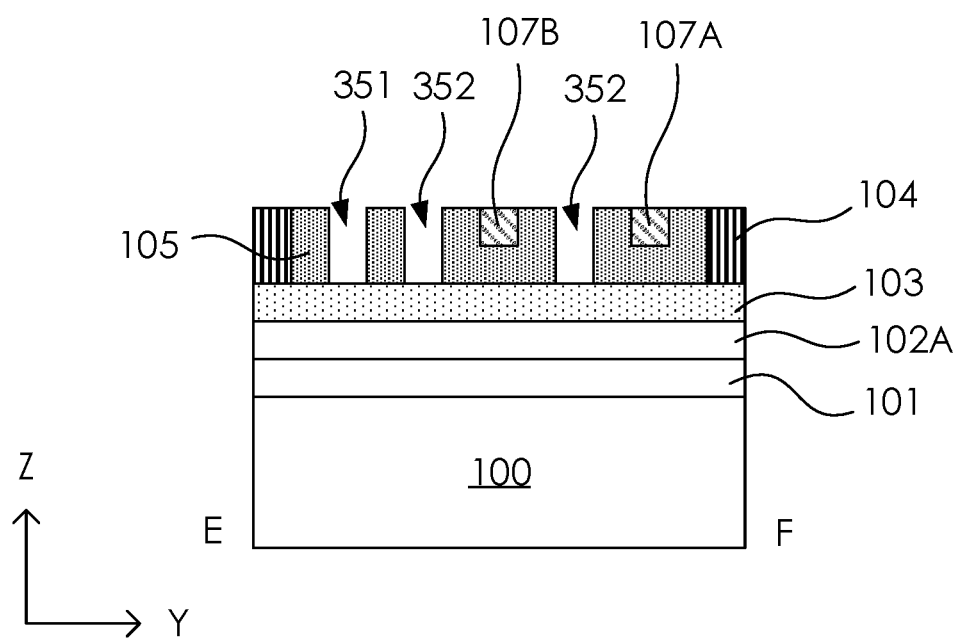
Figure 38:
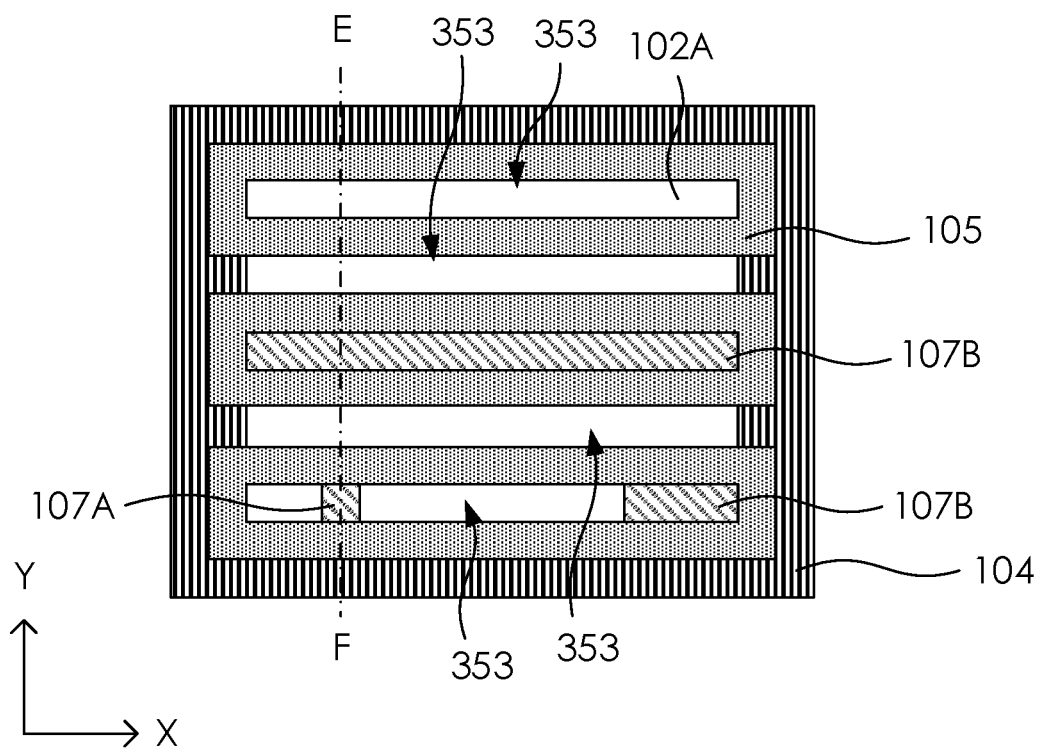
Figure 39:
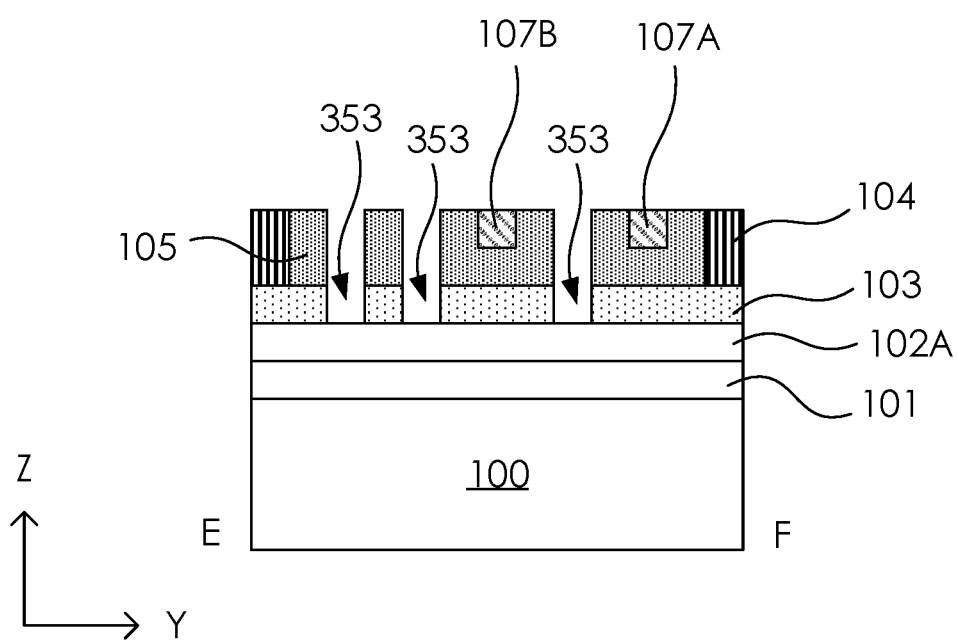

In fact, the patterning operations disclosed in FIGS. 33-35 are the operations for forming the signal lines in the second rows 302 through the self-aligned double patterning technique. Therefore, as shown in FIGS. 36 and 37, in some embodiments, the third bottom layer 106C may be entirely removed to expose the structures therebelow. As shown in the figures, the combination of the mandrels 104, the spacer layer 105, the first block material 107A, and the second block material 107B may be applied as a mask to pattern the first hard mask layer 103 therebelow. Thus, as shown in FIGS. 38 and 39, in some embodiments, the first hard mask layer 103 may be etched to expose the top surface of the dielectric layer 102A. In other words, the first hard mask layer 103 may be patterned accordingly to have a plurality of third openings 353, while these third openings 353 are utilized to pattern the dielectric layer 102A for forming the signal lines.

Figure 40:
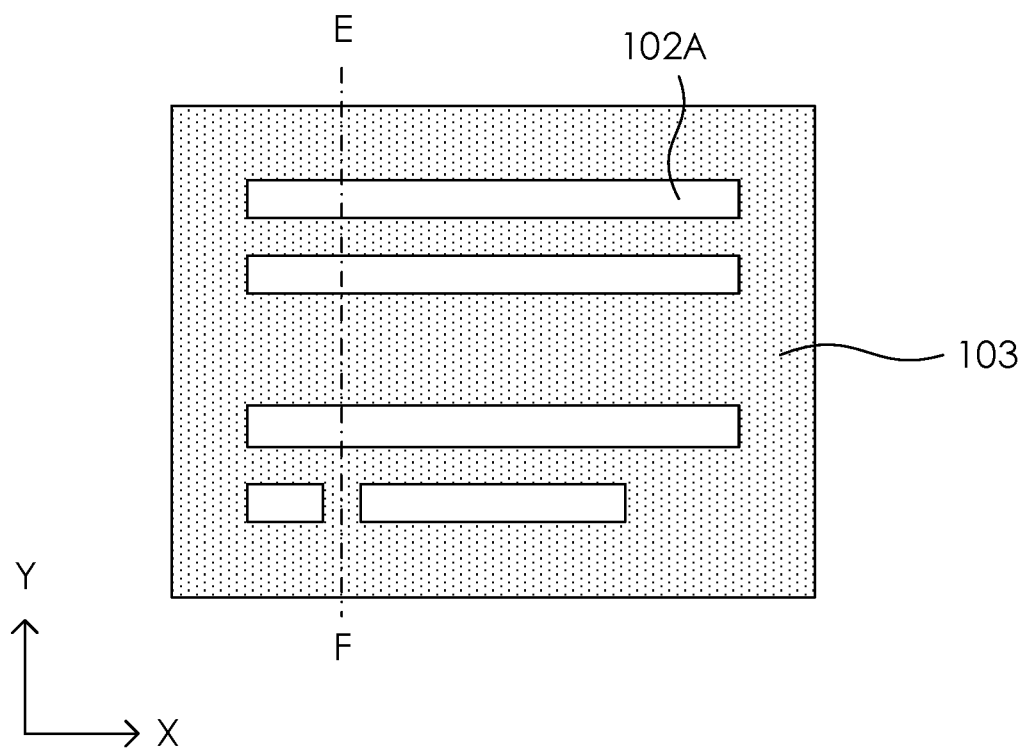
Figure 41:
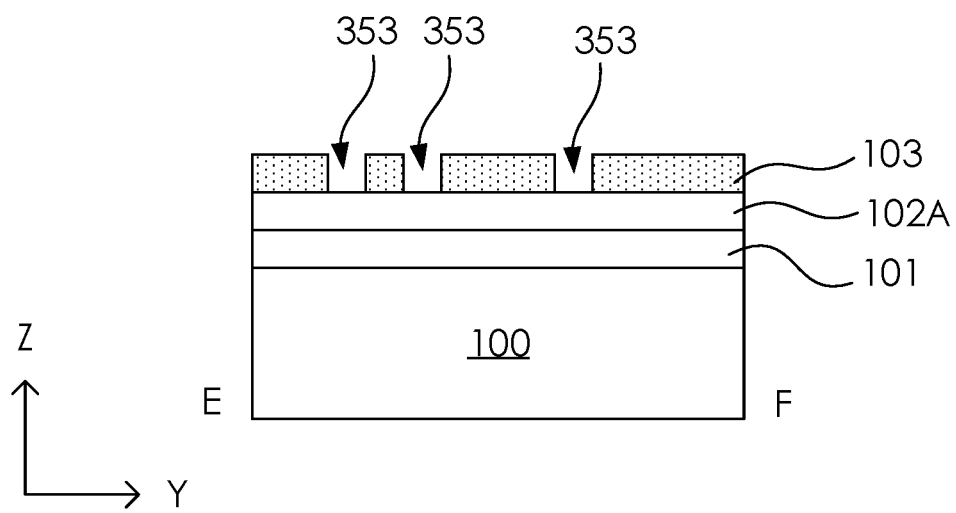

As shown in FIGS. 40 and 41, in some embodiments, the mandrels 104, the spacer layer 105, the first block material 107A, and the second block material 107B are removed and the top surface of the first hard mask layer 103 is exposed accordingly. The mandrels 104, the spacer layer 105, the first block material 107A, and the second block material 107B may be removed using, for example, a planarization process, an etch process, or other suitable processes.

Figure 42:
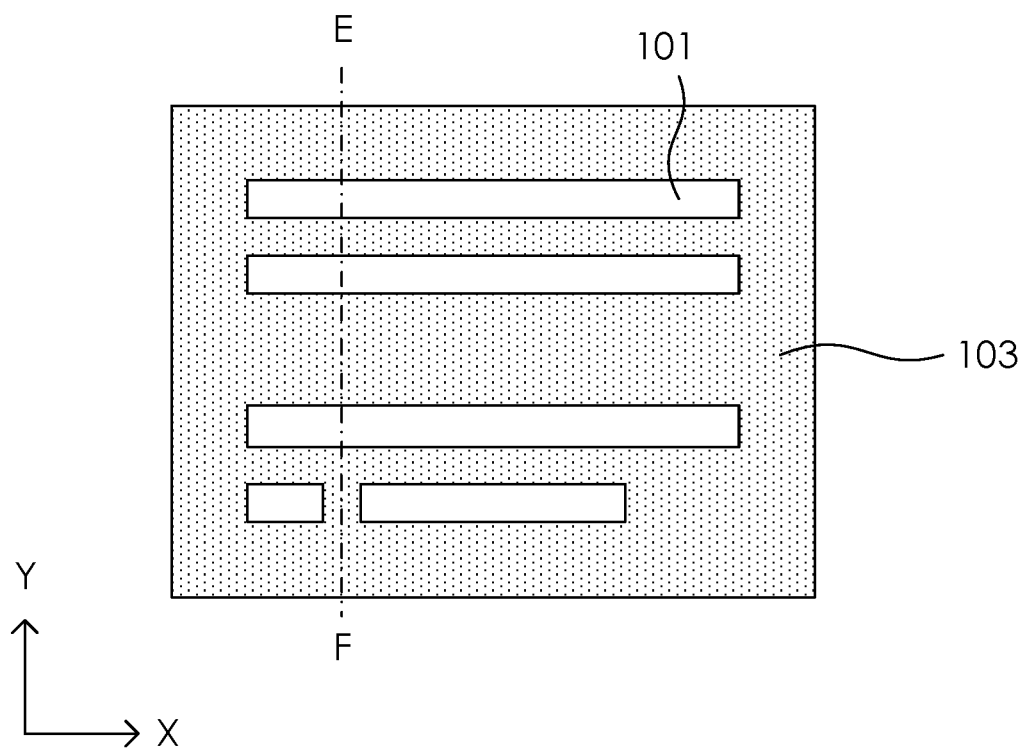
Figure 43:
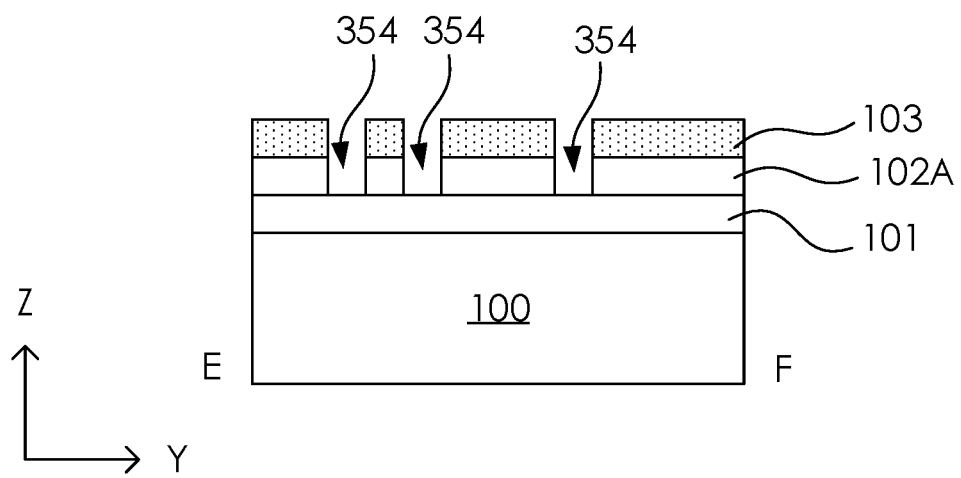

As shown in FIGS. 42 and 43, particularly, as illustrated in FIG. 43, the dielectric layer 102A may be patterned through the patterned first hard mask layer 103, and the top surface of the MEOL structure 101 is exposed accordingly. In other words, the first hard mask layer 103 may be used as an etch mask to etch the underlying dielectric layer 102A. The desired pattern is transferred to the dielectric layer 102A so that a plurality of fourth openings 354 are formed in the dielectric layer 102A. These fourth openings 354 may be utilized to form the signal lines laterally surrounded by the dielectric layer 102A and electrically connected to the conductive vias (not shown in the figure) in the MEOL structure 101.

Figure 44:
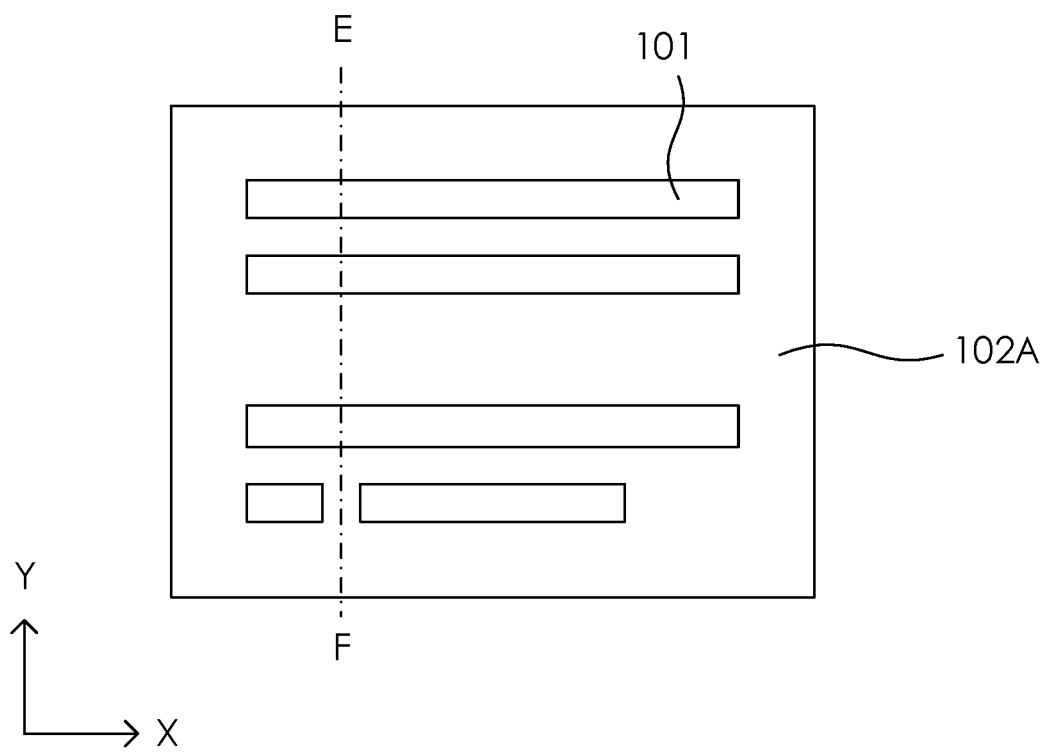
Figure 45:
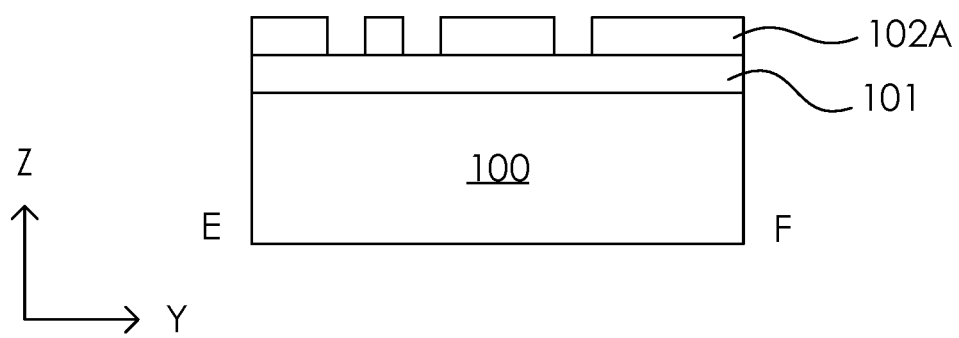
Figure 46:
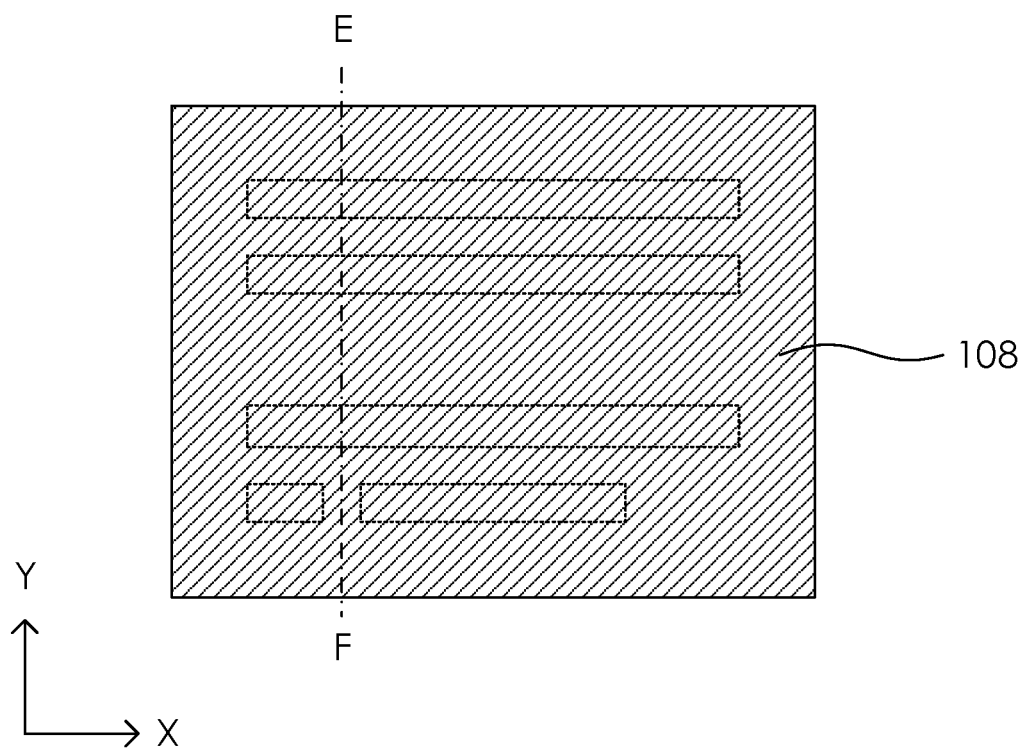
Figure 47:
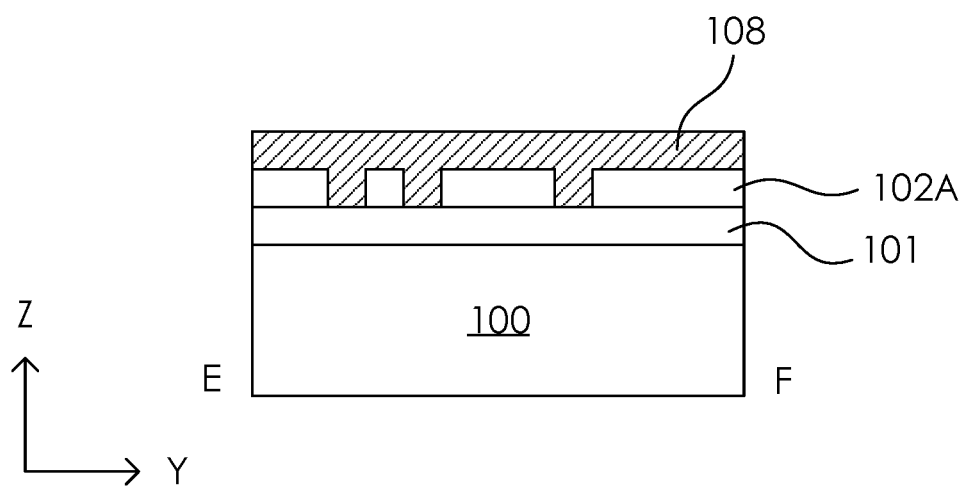

As shown in FIGS. 43 and 44, in some embodiments, the first hard mask layer 103 is removed and the top surface of the dielectric layer 102A is exposed accordingly. The first hard mask layer 103 may be removed using, for example, a planarization process, an etch process, or other suitable processes.

As shown in FIGS. 46 to 49, in some embodiments, a subsequent fill process to form signal lines 21 may be implemented. In some embodiments, the fourth openings 354 are filled with conductive material 108 such as copper, although other suitably conductive materials may alternatively be utilized. In other embodiments, the conductive lines/signal lines 21 may be formed using a damascene process prior to removing the first hard mask layer 103, by which a portion of the dielectric layer is removed to form an opening, and the opening is filled and overfilled with the conductive material, such as copper. The overfilled conductive material 108 with the first hard mask layer 103 may be removed using, for example, a planarization process, an etch process, or other suitable processes.

Figure 48:
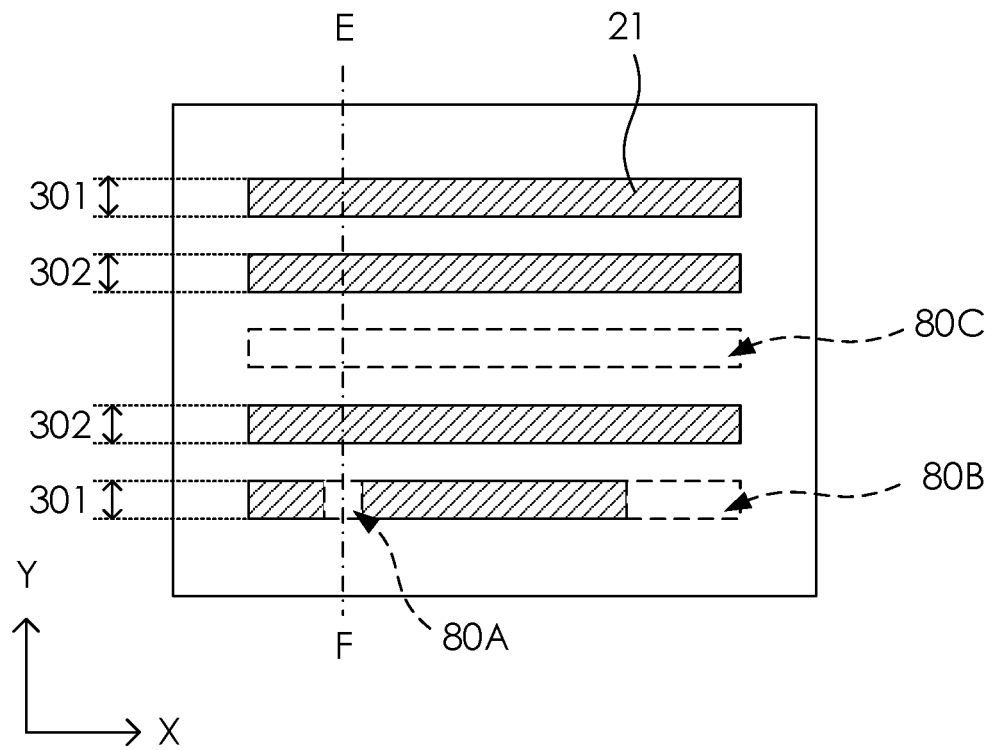
Figure 49:
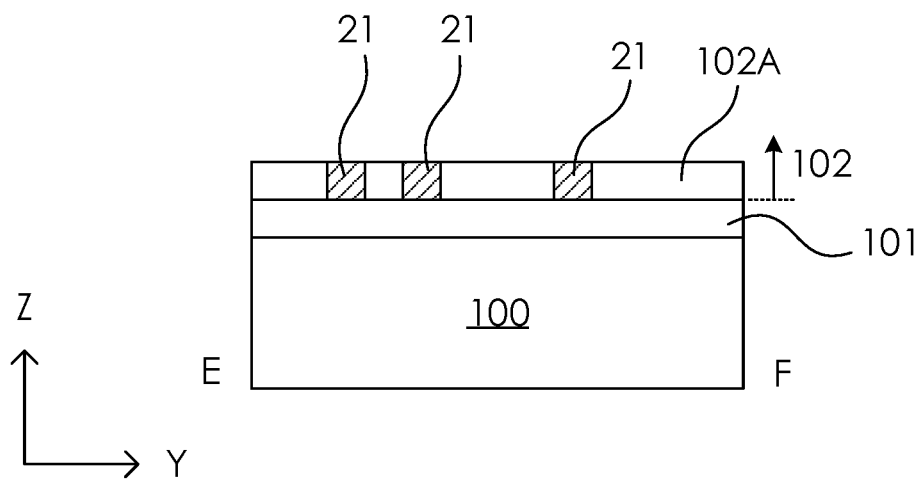

As illustrate in FIG. 48, in such embodiments, the signal lines 21 are formed and arranged in a plurality of rows, wherein the signal lines 21 in the first rows 301 are the metal lines formed as the set of lines correspond to the spaces between adjacent line-shaped features of the mandrel, and the signal lines 21 in the second rows 302 are the metal lines formed as the set of lines correspond to line-shaped features of the mandrel. As shown in the figure, the region 80A between the adjacent signal lines 21 is to illustrate that the signal lines 21 are isolated by using the metal cuts (i.e., the first block material 107A in FIG. 38), while by using an additional lithography mask, the coverage of the metal cuts may be broadened. Referring to the regions 80B and 80C in FIG. 48, the region 80B between the boundary 401 of the cell region and the signal line 21 is to illustrate that the signal line 21 in the first row 301 can be shortened to remove the redundant portion, and the region 80C between the second rows 302 is to illustrate that the signal line within a dummy single row may be entirely waived from forming.

According to the present disclosure, the redundant/dummy portions of the signal lines formed through the self-aligned double patterning technique may be reduced by broadening the coverage of the metal-cuts through an additional lithography mask. Specifically, the formation of the redundant/dummy portions of the signal lines within the first rows (i.e., the metal lines formed as the second set of lines corresponds to the spaces between adjacent line-shaped features of the mandrel) may be avoided, and the parasitic capacitance issues induced by the signal lines in the semiconductor structure may be alleviated significantly. Meanwhile, the performance of the semiconductor structure may be improved.

In one exemplary aspect, a semiconductor structure is provided. The semiconductor structure includes a substrate and a metallization layer. The metallization layer is disposed over the substrate. The metallization layer includes a first signal line, a second signal line, and a third signal line, wherein the first signal line, the second signal line, and the third signal line are arranged in a first row between a power rail and a ground rail parallel to the power rail. A first distance between the first signal line and the second signal line is different from a second distance between the second signal line and the third signal line.

In another exemplary aspect, a semiconductor structure is provided. The semiconductor structure includes a substrate and a metallization layer. The substrate has a plurality of cell regions. The metallization layer is disposed over the substrate. The metallization layer in one of the cell regions includes a power rail, a ground rail parallel to the power rail, and a plurality of first rows and a plurality of second rows parallel to the power rail and between the power rail and the ground rail. Each of the first rows and the second rows comprises at least one signal line. A first distance between two adjacent signal lines in the first rows is greater than a second distance between two adjacent signal lines in the second rows.

In yet another exemplary aspect, a method for manufacturing a semiconductor structure is provided. The method includes the operations as follows. A hard mask layer is formed over a dielectric layer, the dielectric layer is over a substrate. A plurality of mandrels are formed over the hard mask layer. A spacer layer is formed over the hard mask layer and the mandrels, the spacer layer includes a plurality of trenches between the mandrels. A first portion of the trenches is filled by a first block material. A second portion of the trenches is filled by a second block material after filling the first portion of the trenches by a first block material, wherein a third portion of the trenches are free from filled by the first block material and the second block material. At least a first opening is formed in the spacer layer. At least a second opening is formed by removing a portion of the mandrels. The hard mask layer is etched through the first opening and the second opening. The dielectric layer is patterned through the hard mask layer. A plurality of conductive lines are formed in the patterned dielectric layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate; and a metallization layer over the substrate, the metallization layer comprises a plurality of first rows and a plurality of second rows alternately arranged between a power rail and a ground rail parallel to the power rail, the first rows are parallel to the second rows, the metallization layer further comprises:
a plurality of signal lines arranged in the first row and the second row, the plurality of signal lines in the first row comprises:
a first signal line, a second signal line, and a third signal line, the first signal line, the
second signal line, and the third signal line are parallel to the power rail; and
a plurality of vias in contact with the plurality of signal lines in the first row and the second row, each of the signal lines in the first rows is free from having a dummy portion, at least a signal line in each of the second rows comprises a dummy portion;
wherein a first distance between the first signal line and the second signal line is different from a second distance between the second signal line and the third signal line.

2. The semiconductor structure of claim 1, wherein the metallization layer further comprises a fourth signal line and a fifth signal line arranged in the second row between the power rail and the ground rail, and a third distance between the fourth signal line and the fifth signal line is different from the first distance.

3. The semiconductor structure of claim 1, wherein a ratio between a width of the power rail and a width of the first signal line is greater than 2.

4. The semiconductor structure of claim 1, wherein a first length of the first row and a second length of the second row in a cell region are different.

5. The semiconductor structure of claim 4, wherein the first length is less than the second length.

6. The semiconductor structure of claim 1, wherein a length of each of the plurality of signal lines in the first row is substantially identical to a length of a conductive path between the plurality of vias in contact with the plurality of signal lines.

7. A semiconductor structure, comprising:
a substrate having a plurality of cell regions; and
a metallization layer over the substrate, the metallization layer in one of the cell regions comprises:
a power rail;
a ground rail parallel to the power rail;
a plurality of first rows and a plurality of second rows alternately arranged between the power rail and the ground rail, the first rows are parallel to the second rows, each of the first rows and the second rows comprises a plurality of signal lines; and
a plurality of vias in contact with the plurality of signal lines in the first rows and the second rows, each of the signal lines in the first rows is free from having a dummy portion, at least a signal line in each of the second rows comprises a dummy portion;
wherein a first distance between two adjacent signal lines in the first rows is greater than a second distance between two adjacent signal lines in the second rows.

8. The semiconductor structure of claim 7, wherein a width between the first row and the second row is identical to a width of the first row.

9. The semiconductor structure of claim 8, wherein the width of the first row is identical to a width of the second row.

10. The semiconductor structure of claim 7, wherein a cell boundary of the cell region is more in proximity to an end of the second row than an end of the first row.

11. The semiconductor structure of claim 7, wherein a third distance between each of two adjacent signal lines in the second rows is the same.

12. The semiconductor structure of claim 7, wherein each of the vias in contact with the plurality signal lines in the first rows is substantially close to at least three edges of the signal line contact thereto to the same extent.

13. The semiconductor structure of claim 7, wherein two of the vias in contact with at least one of the signal lines are vertically aligned, and a projective profile of the at least one of the signal lines is substantially same with a projective profile of the vias.

14. The semiconductor structure of claim 7, wherein a number of the second rows is identical or equal to a number of the first rows between the power rail and the ground rail.

15. A semiconductor structure, comprising:
a substrate having a plurality of cell regions; and
a metallization layer over the substrate, the metallization layer in one of the cell regions comprises:
a power rail;
a ground rail parallel to the power rail;
a first row parallel to the power rail and between the power rail and the ground rail, the first row comprises a plurality of signal lines;
two second rows parallel to the power rail and between the power rail and the ground rail; and
a plurality of vias in contact with the plurality of signal lines in the first row
wherein each of the first row and the two second rows comprises a plurality of signal lines, each of the signal lines in the first row is free from having a dummy portion, at least a signal line in each of the two second rows comprises a dummy portion, and a first distance between two adjacent signal lines in the first row is greater than a second distance between two adjacent signal lines in at least one of the two second rows, and further wherein the first row is not located between the two second rows.

16. The semiconductor structure of claim 15, wherein a distance between the two second rows without having the first row therebetween is three times as much as a distance between the first row and one of the two second rows.

17. The semiconductor structure of claim 15, wherein a ratio between a width of the power rail and a width of each of the signal lines is greater than 2.

18. The semiconductor structure of claim 15, wherein a cell boundary of the cell region is more in proximity to an end of each of the two second rows than an end of the first row.

19. The semiconductor structure of claim 15, wherein a length of the first row is shorter than a length of each of the two second rows in the cell region.

20. The semiconductor structure of claim 15, wherein a region between the two second rows is free from having conductive material from a top view perspective.

* * * * *